United States Patent
Hodo et al.

(10) Patent No.: US 11,088,286 B2
(45) Date of Patent: Aug. 10, 2021

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Ryota Hodo, Atsugi (JP); Daisuke Matsubayashi, Yokohama (JP); Motomu Kurata, Isehara (JP); Ryunosuke Honda, Isehara (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 16/645,669

(22) PCT Filed: Sep. 10, 2018

(86) PCT No.: PCT/IB2018/056862
§ 371 (c)(1),
(2) Date: Mar. 9, 2020

(87) PCT Pub. No.: WO2019/053573
PCT Pub. Date: Mar. 21, 2019

(65) Prior Publication Data
US 2020/0279951 A1 Sep. 3, 2020

(30) Foreign Application Priority Data
Sep. 15, 2017 (JP) ............... JP2017-177432

(51) Int. Cl.
*H01L 21/02* (2006.01)
*H01L 29/66* (2006.01)
(Continued)

(52) U.S. Cl.
CPC ...... *H01L 29/7869* (2013.01); *H01L 21/0217* (2013.01); *H01L 21/02178* (2013.01);
(Continued)

(58) Field of Classification Search
CPC ............. H01L 29/7869; H01L 29/24; H01L 29/66969; H01L 29/78603;
(Continued)

(56) References Cited

U.S. PATENT DOCUMENTS 8,384,080 B2  2/2013  Taniguchi et al.
8,547,771 B2  10/2013  Koyama
(Continued)

FOREIGN PATENT DOCUMENTS

CN  105960712 A  9/2016
DE  112015000676  11/2016
(Continued)

OTHER PUBLICATIONS

International Search Report (Application No. PCT/IB2018/056862) dated Nov. 20, 2018.
(Continued)

*Primary Examiner* — Tong-Ho Kim
(74) *Attorney, Agent, or Firm* — Robinson Intellectual Property Law Office; Eric J. Robinson

(57) ABSTRACT

A semiconductor device with excellent electric characteristics is provided. The semiconductor device includes an oxide in a channel formation region. The semiconductor device includes the oxide over a substrate, a first insulator over the oxide, a second insulator over the first insulator, a third insulator, and a conductor over the third insulator. The oxide and the first insulator are in contact with each other in a region. An opening exposing the oxide is provided in the first insulator and the second insulator. The third insulator is placed to cover an inner wall and a bottom surface of the opening. The conductor is placed to fill the opening. The conductor has a region overlapping with the oxide with the
(Continued)

third insulator between the conductor and the oxide. The first insulator contains an element other than a main component of the oxide.

15 Claims, 30 Drawing Sheets

(51) Int. Cl.
*H01L 27/105* (2006.01)
*H01L 29/786* (2006.01)
*H01L 29/24* (2006.01)

(52) U.S. Cl.
CPC .... *H01L 21/02565* (2013.01); *H01L 27/1052* (2013.01); *H01L 29/24* (2013.01); *H01L 29/66969* (2013.01); *H01L 29/78603* (2013.01); *H01L 29/78696* (2013.01)

(58) Field of Classification Search
CPC ........... H01L 29/78696; H01L 21/0217; H01L 21/02565; H01L 21/02178; H01L 27/1052
USPC .......................................................... 257/43
See application file for complete search history.

(56) References Cited

U.S. PATENT DOCUMENTS

| | | | |
|---|---|---|---|
| 8,692,252 B2 | 4/2014 | Takata et al. | |
| 8,995,174 B2 | 3/2015 | Koyama | |
| 9,530,894 B2 | 12/2016 | Koezuka et al. | |
| 9,847,358 B2 | 12/2017 | Koezuka et al. | |
| 10,367,013 B2 | 7/2019 | Koezuka et al. | |
| 2015/0228799 A1 | 8/2015 | Koezuka et al. | |
| 2015/0280691 A1 | 10/2015 | Koyama | |
| 2016/0218219 A1* | 7/2016 | Asami | H01L 27/1225 |
| 2017/0053950 A1 | 2/2017 | Koezuka et al. | |
| 2017/0236839 A1* | 8/2017 | Yamazaki | H01L 21/0214 257/43 |
| 2018/0151603 A1 | 5/2018 | Koezuka et al. | |
| 2018/0375498 A1 | 12/2018 | Koyama | |
| 2019/0355764 A1 | 11/2019 | Koezuka et al. | |

FOREIGN PATENT DOCUMENTS

| | | |
|---|---|---|
| JP | 2001-291770 A | 10/2001 |
| JP | 2011-124360 A | 6/2011 |
| JP | 2011-138934 A | 7/2011 |
| JP | 2012-257187 A | 12/2012 |
| JP | 2015-188062 A | 10/2015 |
| JP | 2016-111233 A | 6/2016 |
| JP | 2017-034051 A | 2/2017 |
| KR | 2016-0118303 A | 10/2016 |
| TW | 201531764 | 8/2015 |
| WO | WO-2012/017843 | 2/2012 |
| WO | WO-2015/118472 | 8/2015 |

OTHER PUBLICATIONS

Written Opinion (Application No. PCT/IB2018/056862) dated Nov. 20, 2018.

* cited by examiner

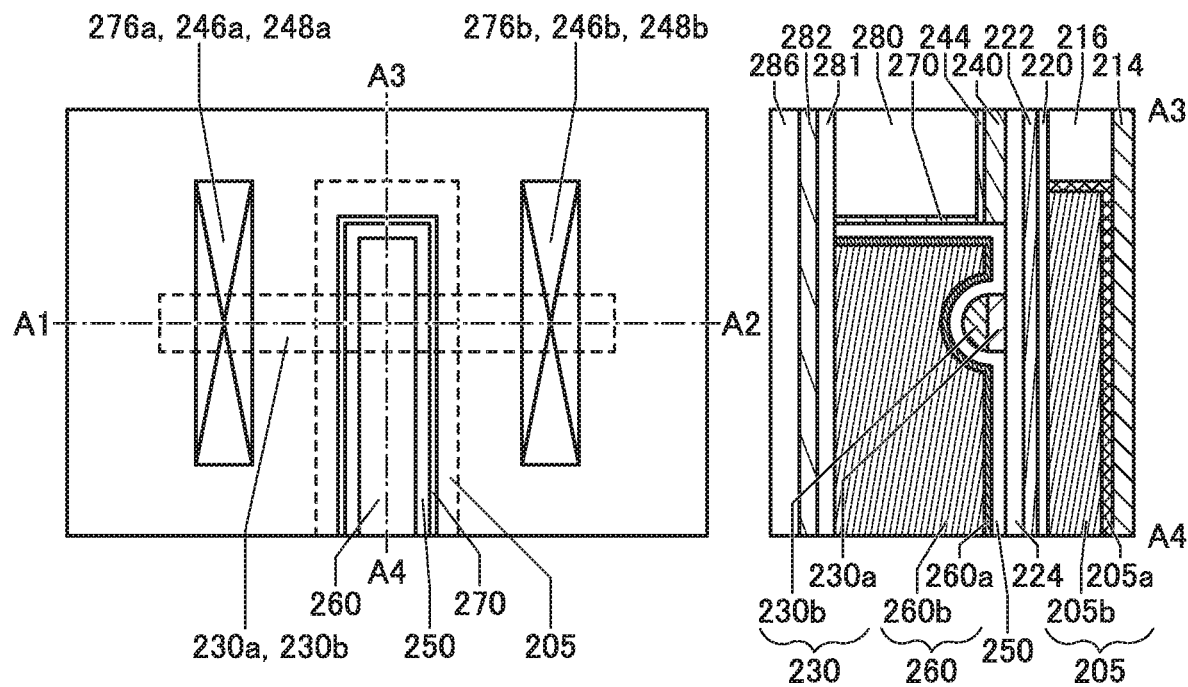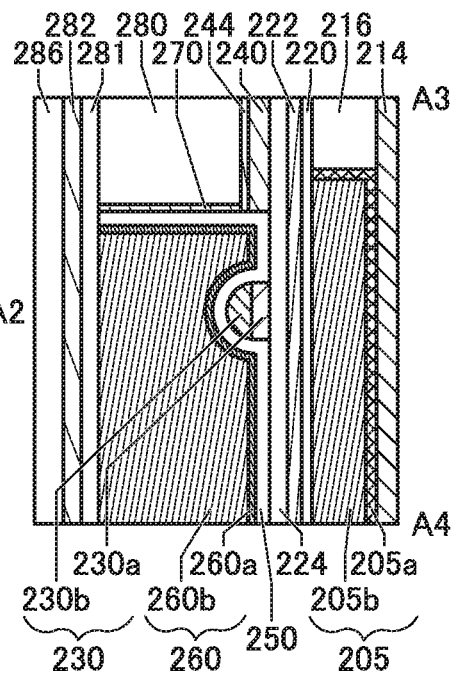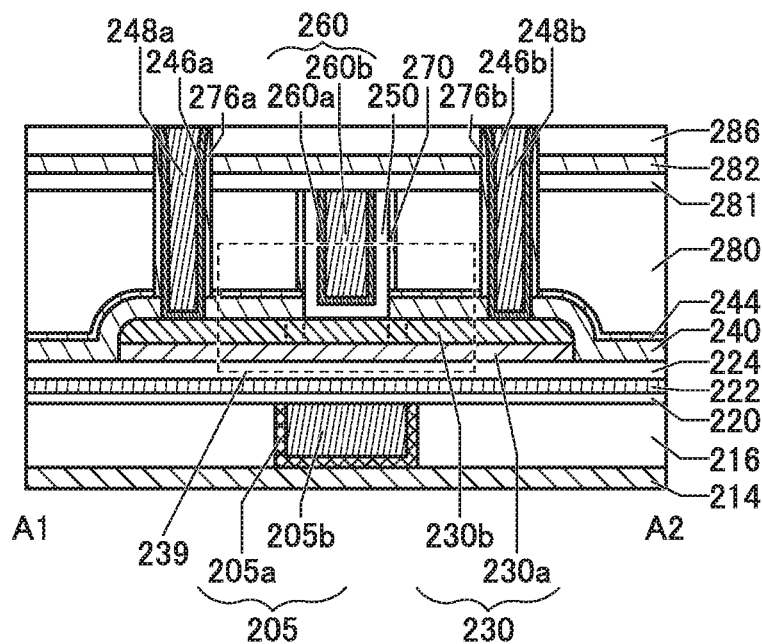

FIG. 4A
200
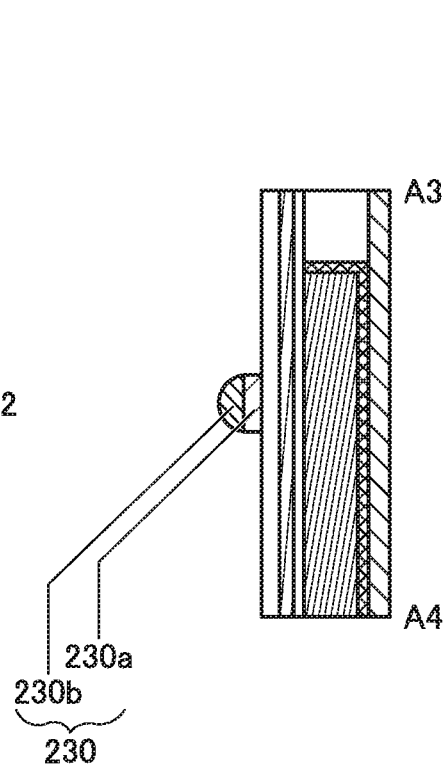
FIG. 4C
FIG. 4B
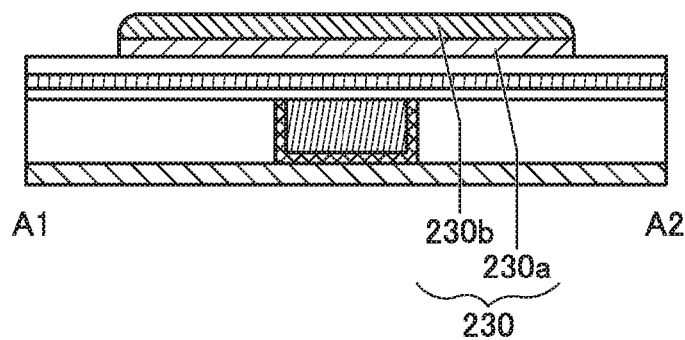

200

200

200

200

FIG. 11A
FIG. 11C
FIG. 11B
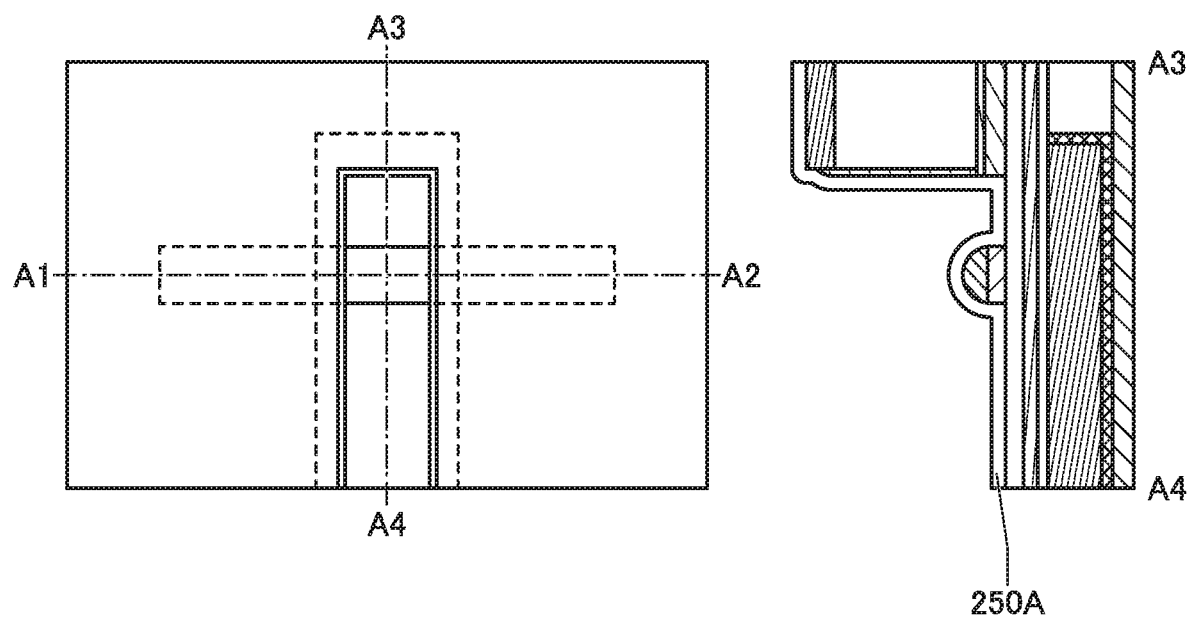
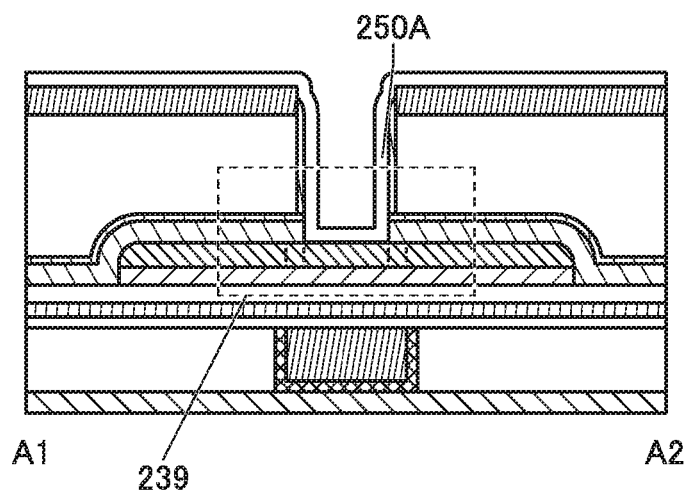

200

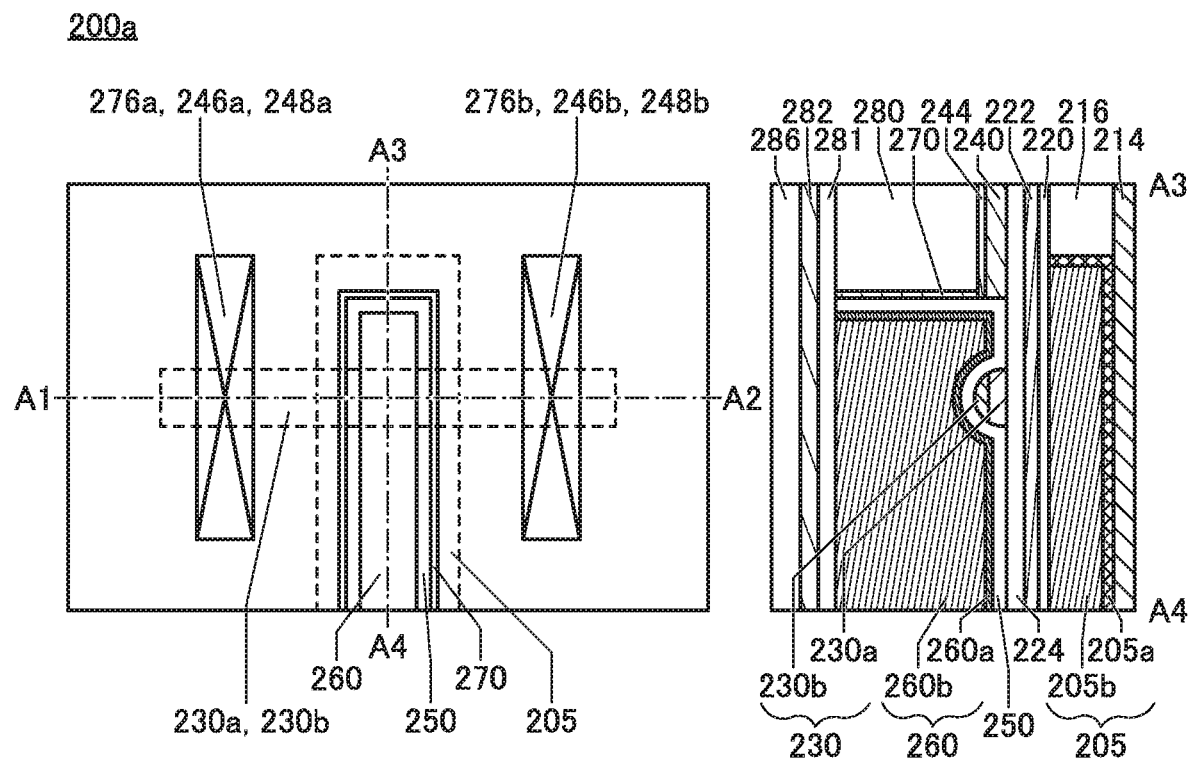
FIG. 14A
FIG. 14C
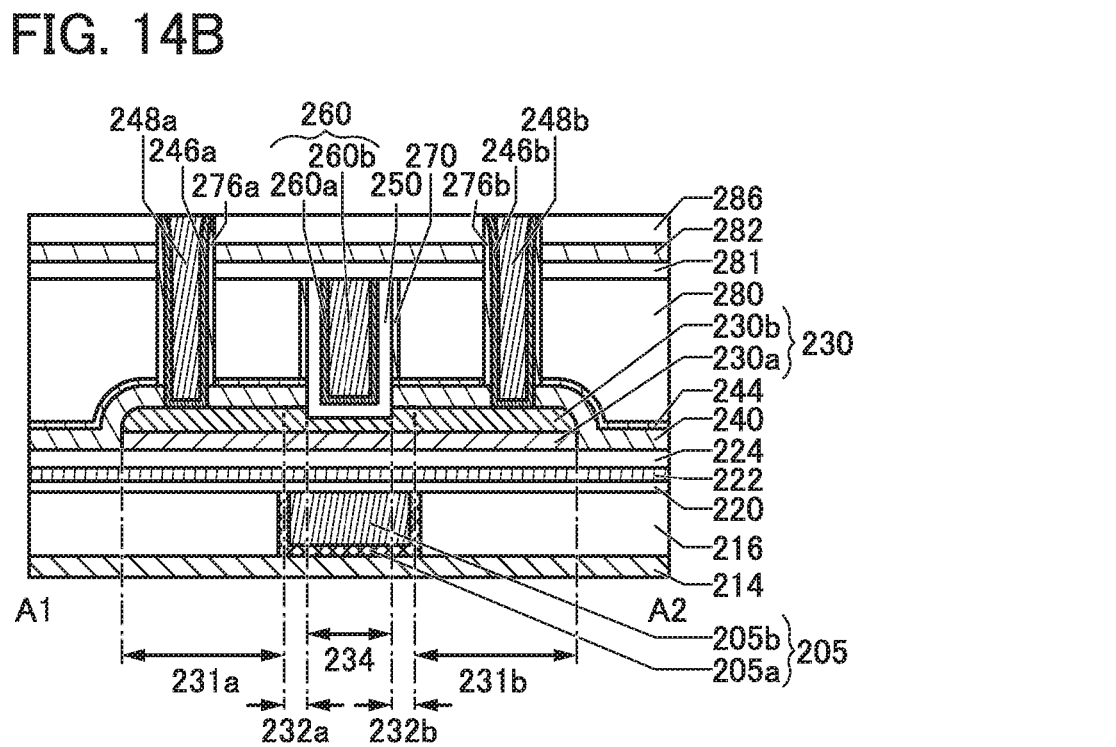
FIG. 14B

FIG. 15A
FIG. 15C
FIG. 15B
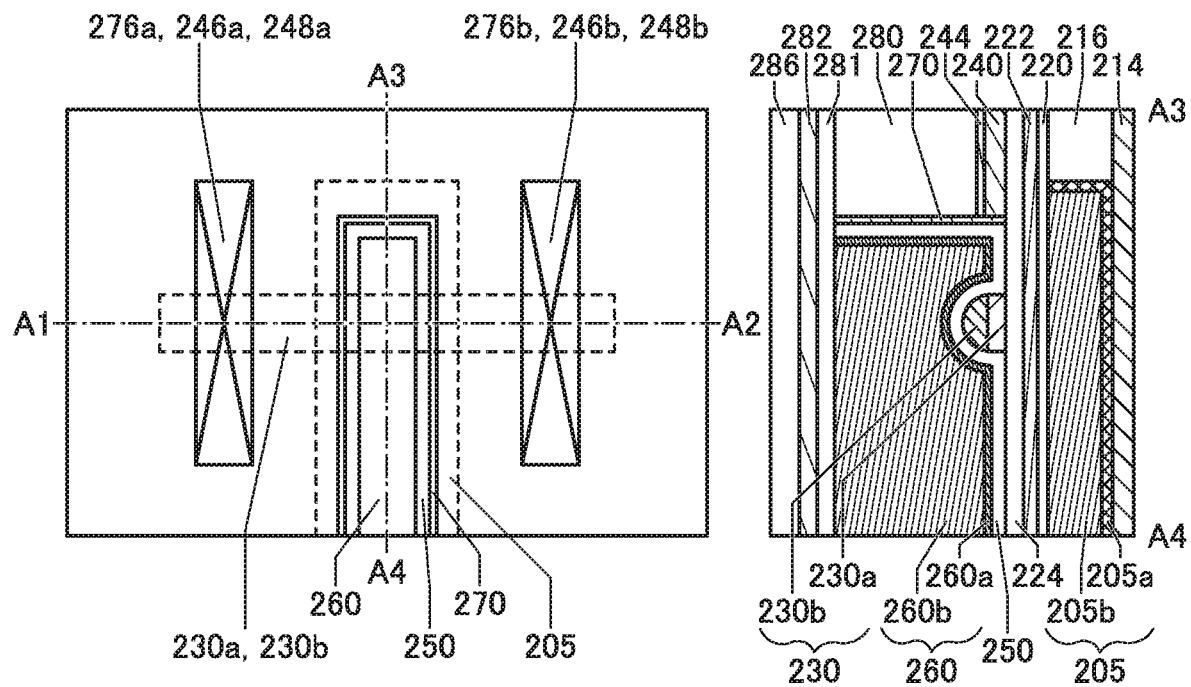
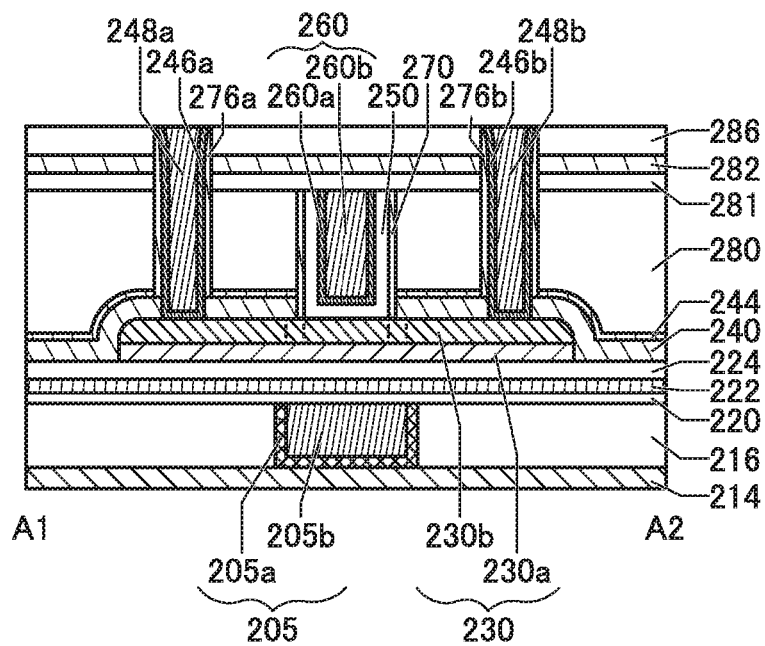

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

BACKGROUND ART

In recent years, semiconductor devices have been developed and an LSI, a CPU, and a memory are mainly used. A CPU includes a semiconductor integrated circuit (at least a transistor and a memory) separated from a semiconductor wafer, which is an aggregation of semiconductor elements each provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique of forming a transistor with use of a semiconductor thin film formed over a substrate having an insulating surface has been attracting attention. Such a transistor is widely used in electronic devices such as an integrated circuit (IC) and an image display device (also simply referred to as a display device). A widely known semiconductor thin film that can be used for the transistor is a silicon-based semiconductor material; an oxide semiconductor has attracted attention as another material.

A transistor including an oxide semiconductor is known for its extremely low leakage current (off current) in a non-conduction state. For example, a low-power-consumption CPU or the like utilizing the low leakage current property of the transistor having an oxide semiconductor has been disclosed (see Patent Document 1).

In addition, a technique of stacking oxide semiconductor layers with different electron affinities (or varied energy differences from the vacuum level to the conduction band minimum) to increase the carrier mobility of a transistor has been disclosed (see Patent Document 2 and Patent Document 3).

Reductions in size and weight of electronic devices in recent years have boosted demand for an IC in which transistors and the like are integrated at a high density. In addition, the productivity of a semiconductor device including an IC is required to be improved.

REFERENCES

Patent Document

[Patent Document 1] Japanese Published Patent Application No. 2012-257187
[Patent Document 2] Japanese Published Patent Application No. 2011-124360
[Patent Document 3] Japanese Published Patent Application No. 2011-138934

SUMMARY OF THE INVENTION

Problems to be Solved by the Invention

An object of one embodiment of the present invention is to provide a semiconductor device with high reliability. Another object of one embodiment of the present invention is to provide a semiconductor device with favorable electrical characteristics. Another object of one embodiment of the present invention is to provide a semiconductor device that can retain data for a long time.

Note that the descriptions of these objects do not disturb the existence of other objects. In one embodiment of the present invention, there is no need to achieve all of these objects. Objects other than these will be apparent from and can be derived from the descriptions of the specification, the drawings, the claims, and the like.

Means for Solving the Problems

One embodiment of the present invention is a semiconductor device including an oxide in a channel formation region. The semiconductor device includes the oxide over a substrate, a first insulator over the oxide, a second insulator over the first insulator, a third insulator, and a conductor over the third insulator. The oxide and the first insulator are in contact with each other in a region. An opening exposing the oxide is provided in the first insulator and the second insulator. The third insulator is placed to cover an inner wall and a bottom surface of the opening. The conductor is placed to fill the opening. The conductor includes a region overlapping with the oxide with the third insulator between the conductor and the oxide. The first insulator contains an element other than a main component of the oxide.

Another embodiment of the present invention is a semiconductor device including an oxide in a channel formation region. The semiconductor device includes the oxide over a substrate, a first insulator over the oxide, a second insulator over the first insulator, a third insulator, a conductor over the third insulator, a fourth insulator, a fifth insulator, a sixth insulator, a first wiring, and a second wiring. The oxide and the first insulator are in contact with each other in a region. A first opening exposing the oxide is provided in the first insulator and the second insulator. The third insulator is placed to cover an inner wall and a bottom surface of the first opening. The conductor is placed to fill the opening. The conductor includes a region overlapping with the oxide with the third insulator between the conductor and the oxide. The first insulator contains an element other than a main component of the oxide. The fourth insulator is placed over the second insulator, the third insulator, and the conductor. A second opening and a third opening each exposing the oxide are provided in the first insulator, the second insulator, and the fourth insulator. The fifth insulator is placed to cover an inner wall of the second opening. The first wiring is placed to fill the second opening. The sixth insulator is placed to cover an inner wall of the third opening. The second wiring is placed to fill the third opening.

In the above embodiment, the oxide is preferably an In—Ga—Zn oxide.

In the above embodiment, the element is preferably at least one of hydrogen and nitrogen.

In the above embodiment, the first insulator is preferably a silicon nitride film.

In the above embodiment, an aluminum oxide is preferably contained between the first insulator and the second insulator and/or between the second insulator and the third insulator.

Another embodiment of the present invention is a method for manufacturing a semiconductor device including the steps of forming an oxide over a substrate, forming a first insulator over the oxide such that the first insulator is in contact with the oxide, forming a second insulator over the first insulator, forming an opening reaching the oxide in the second insulator and the first insulator, forming a third insulator such that the third insulator covers an inner wall and a bottom surface of the opening, depositing a conductor over the third insulator such that the conductor fills the opening, and removing part of the conductor such that a conductor embedded in the opening is formed.

In the above embodiment, the oxide is preferably an In—Ga—Zn oxide.

In the above embodiment, the first insulator is preferably a silicon nitride film.

Effects of the Invention

One embodiment of the present invention can provide a semiconductor device with high reliability. One embodiment of the present invention can provide a semiconductor device with favorable electrical characteristics. One embodiment of the present invention can provide a semiconductor device that can retain data for a long time.

Note that the descriptions of these effects do not disturb the existence of other effects. One embodiment of the present invention does not have to have all of these effects. Other effects will be apparent from and can be derived from the descriptions of the specification, the drawings, the claims, and the like.

BRIEF DESCRIPTION OF THE DRAWINGS

FIG. 1 A top view and cross-sectional views of a semiconductor device of one embodiment of the present invention.

FIG. 4 A top view and cross-sectional views illustrating a method for manufacturing a semiconductor device of one embodiment of the present invention.

FIG. 11 A top view and cross-sectional views illustrating a method for manufacturing a semiconductor device of one embodiment of the present invention.

FIG. 14 A top view and cross-sectional views illustrating a semiconductor device of one embodiment of the present invention.

FIG. 15 A top view and cross-sectional views illustrating a semiconductor device of one embodiment of the present invention.

MODE FOR CARRYING OUT THE INVENTION

Figure 2A:
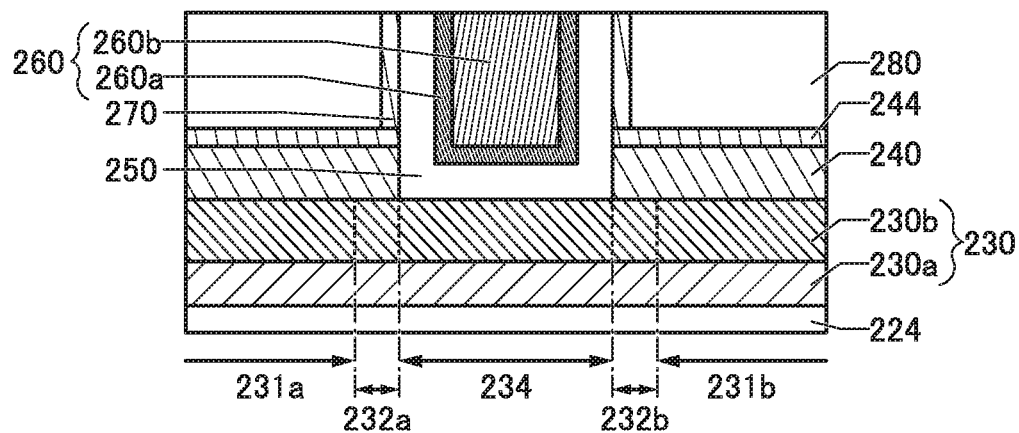
FIG. 2 Cross-sectional views of a semiconductor device of one embodiment of the present invention.

Hereinafter, embodiments will be described with reference to drawings. Note that the embodiments can be implemented with many different modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings schematically illustrate ideal examples, and embodiments of the present invention are not limited to shapes or values shown in the drawings. In the drawings, the same portions or portions having similar functions are denoted by the same reference numerals in different drawings, and explanation thereof will not be repeated. Furthermore, the same hatching pattern is applied to portions having similar functions, and the portions are not denoted by reference numerals in some cases.

In particular, in a top view (also referred to as a "plan view"), some components might not be illustrated for easy understanding of the invention. In addition, some hidden lines and the like might not be shown.

Note that the ordinal numbers such as "first," "second," and the like in this specification and the like are used for convenience and do not denote the order of steps or the stacking order of layers. Therefore, for example, description can be made even when "first" is replaced with "second," "third," or the like as appropriate. In addition, the ordinal numbers in this specification and the like are not necessarily the same as those which specify one embodiment of the present invention.

In this specification, terms for describing arrangement, such as "over" and "under", are used for convenience in describing a positional relation between components with reference to drawings. Furthermore, the positional relation between components is changed as appropriate in accordance with a direction in which each component is drawn. Thus, terms for the description are not limited to those used in this specification, and the description can be rephrased appropriately depending on the situation.

In this specification and the like, "parallel" indicates a state where two straight lines are placed at an angle of greater than or equal to −10° and less than or equal to 10°. Thus, the case where the angle is greater than or equal to −5° and less than or equal to 5° is also included. In addition, the term "substantially parallel" indicates a state where two straight lines are placed at an angle of greater than or equal to −30° and less than or equal to 30°. Moreover, "perpendicular" indicates a state where two straight lines are placed at an angle of greater than or equal to 80° and less than or equal to 100°. Thus, the case where the angle is greater than or equal to 85° and less than or equal to 95° is also included. Furthermore, "substantially perpendicular" indicates a state where two straight lines are placed at an angle of greater than or equal to 60° and less than or equal to 120°.

In this specification and the like, the term "film" and the term "layer" can be interchanged with each other. For example, the term "conductive layer" can be changed into the term "conductive film" in some cases. For example, the term "insulating film" can be changed into the term "insulating layer" in some cases.

In addition, in this specification and the like, the term "insulator" can be replaced with insulating film or insulating layer. Moreover, the term "conductor" can be replaced with conductive film or conductive layer. Furthermore, the term "semiconductor" can be replaced with semiconductor film or semiconductor layer.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

Note that in this specification, a barrier film refers to a film having a function of suppressing transmission of oxygen and impurities such as hydrogen; in the case where the barrier film has conductivity, the film is referred to as a conductive barrier film in some cases.

In this specification and the like, a metal oxide means an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS FET or an OS transistor in the description can also be referred to as a transistor including a metal oxide or an oxide semiconductor.

Note that an impurity in a semiconductor refers to, for example, elements other than the main components of a semiconductor. For example, an element with a concentration of lower than 0.1 atomic % can be regarded as an impurity. When an impurity is contained, for example, defect states may be formed in the semiconductor or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by entry of impurities, for example. Furthermore, when the semiconductor is silicon, examples of the impurity which changes characteristics of the semiconductor include oxygen, Group 1 elements except hydrogen, Group 2 elements, Group 13 elements, and Group 15 elements.

In this specification and the like, a transistor is an element having at least three terminals of a gate, a drain, and a source. In addition, the transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current is changed in circuit operation, for example. Therefore, the terms "source" and "drain" are used interchangeably in this specification and the like.

Note that the channel length refers to, for example, the distance between a source (a source region or a source electrode) and a drain (a drain region or a drain electrode) in a region where a semiconductor (or a portion where current flows in a semiconductor when a transistor is in an on state) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of the values, the maximum value, the minimum value, or the average value in a region where a channel is formed.

The channel width refers to, for example, the length of a portion where a source and a drain face each other in a region where a semiconductor (or a portion where current flows in a semiconductor when a transistor is in an on state) and a gate electrode overlap with each other, or a region where a channel is formed. Note that in one transistor, channel widths in all regions are not necessarily the same. In other words, the channel width of one transistor is not fixed to one value in some cases. Thus, in this specification, the channel width is any one of the values, the maximum value, the minimum value, or the average value in a region where a channel is formed.

Note that depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Thus, in this specification, an apparent channel width is referred to as a "surrounded channel width (SCW)" in some cases. Furthermore, in this specification, the simple term "channel width" refers to a surrounded channel width or an apparent channel width in some cases. Alternatively, in this specification, the simple term "channel width" refers to an effective channel width in some cases. Note that the value of a channel length, a channel width, an effective channel width, an apparent channel width, a surrounded channel width, or the like can be determined, for example, by analyzing a cross-sectional TEM (Transmission Electron Microscope) image and the like.

Unless otherwise specified, transistors described in this specification and the like are enhancement (normally-off) field-effect transistors. Furthermore, unless otherwise specified, transistors described in this specification and the like are n-channel transistors. Thus, unless otherwise specified, the threshold voltage (also referred to as "$V_{th}$") is higher than 0 V.

Embodiment 1

In this embodiment, a structure example of a semiconductor device of one embodiment of the present invention and a manufacturing method thereof will be described with reference to FIG. 1 to FIG. 13. Note that in FIG. 1 to FIG. 13, some components of the semiconductor device are not illustrated for clarity.

<Configuration Example of Semiconductor Device>

A structure example of a semiconductor device including a transistor 200 of one embodiment of the present invention will be described below. FIG. 1 has a top view and cross-sectional views of the transistor 200 and the neighboring area. FIG. 1(A) is the top view. For clarity of the drawing, some components are not illustrated in the top view of FIG. 1(A). FIG. 1(B) is a cross-sectional view of a portion indicated by a dashed-dotted line A1-A2 in FIG. 1(A). That is, FIG. 1(B) is the cross-sectional view of the transistor 200 in the channel length direction. FIG. 1(C) is a cross-sectional view of a portion indicated by a dashed-dotted line A3-A4 in FIG. 1(A). That is, FIG. 1(C) is the cross-sectional view of the transistor 200 in the channel width direction.

The semiconductor device of one embodiment of the present invention includes the transistor 200, a barrier film 276 (a barrier film 276a and a barrier film 276b), an insulator 214, an insulator 216, an insulator 281, an insulator 282, and an insulator 286. The semiconductor device further includes a conductor 246 (a conductor 246a and a conductor 246b) and a conductor 248 (a conductor 248a and a conductor 248b) functioning as a plug.

In addition, the barrier film 276 is formed in contact with a side surface of an opening in the insulator 281, the insulator 282, the insulator 286, and the like. The conductor 246 is formed on a side surface of the barrier film 276 and a bottom surface of the opening, and the conductor 248 is formed on the inside thereof. Here, the top surfaces of the conductor 246 and the conductor 248 can be almost level with the top surface of the insulator 286. Although this embodiment describes the structure in which the conductor functioning as a plug has a two-layer structure of the conductor 246 and the conductor 248, the present invention is not limited thereto. For example, the conductor functioning as a plug may have a single-layer structure or a stacked-layer structure of three or more layers.

As shown in FIG. 1, the transistor 200 of one embodiment of the present invention includes a conductor 260 (a conductor 260a and a conductor 260b) functioning as a first gate (also referred to as a top gate), a conductor 205 (a conductor 205a and a conductor 205b) functioning as a second gate (also referred to as a back gate), an insulator 280 functioning as an interlayer film, a barrier film 270 in contact with an inner wall of an opening in the insulator 280, an insulator 250 functioning as a first gate insulating film, an insulator 220, an insulator 222, and an insulator 224 functioning as a second gate insulating film, an oxide 230 (an oxide 230a and an oxide 230b), an insulator 240 in contact with the oxide 230, and a barrier film 244 in contact with the insulator 240.

In the transistor 200, a metal oxide functioning as a semiconductor (hereinafter also referred to as an oxide semiconductor) is preferably used for the oxide 230 (the oxide 230a and the oxide 230b), which includes a region where a channel is formed (hereinafter also referred to as a channel formation region).

The transistor 200 using an oxide semiconductor in its channel formation region has an extremely low leakage current in a non-conduction state; thus, a semiconductor device with low power consumption can be provided. An oxide semiconductor can be deposited by a sputtering method or the like, and thus can be used for the transistor 200 constituting a highly integrated semiconductor device.

For the oxide 230, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) may be used. Alternatively, for the oxide 230, an In—Ga oxide or an In—Zn oxide may be used.

In addition, the oxide 230 preferably has a stacked-layer structure of oxides which differ in the atomic ratio of metal elements. Specifically, the atomic ratio of the element M to constituent elements in the metal oxide used for the oxide 230a is preferably greater than the atomic ratio of the element M to constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a.

The oxide 230a and the oxide 230b preferably contain a common constituent element (element serving as a main component) besides oxygen. When the oxide 230a and the oxide 230b contain a common constituent element besides oxygen, the density of defect states at an interface between the oxide 230a and the oxide 230b can be low. For example, in the case where the oxide 230b is an In—Ga—Zn oxide, it is preferable to use an In—Ga—Zn oxide, a Ga—Zn oxide, gallium oxide, or the like for the oxide 230a.

The oxide 230 includes the oxide 230a and the oxide 230b over the oxide 230a. The oxide 230b is over the oxide 230a, whereby impurities can be inhibited from being diffused into the oxide 230b from the structure bodies formed below the oxide 230a.

Although a structure in which the two layers of the oxide 230a and the oxide 230b are stacked in the transistor 200 is described, the present invention is not limited thereto. For example, it is possible to employ a structure in which a single layer of the oxide 230b or a stacked-layer structure of three or more layers is provided.

Here, an enlarged view of a region 239 surrounded by a dashed line in FIG. 1(B) is illustrated in FIG. 2(A). As illustrated in FIG. 2(A), the oxide 230b includes a region 231 (a region 231a and a region 231b) functioning as a source region and a drain region of the transistor 200 and a region 234 functioning as a channel formation region of the transistor 200. The region 231 has a high carrier density and a low resistance. The region 234 has a lower carrier density than the region 231.

In some cases, a region 232 (a region 232a and a region 232b) is formed between the region 231 functioning as the source region or the drain region of the transistor 200 and the region 234 functioning as the channel formation region. The carrier density of the region 232 is lower than that of the region 231 and higher than that of the region 234. That is, the region 232 functions as a junction region between the channel formation region and the source region or the drain region. With the junction region, the transistor 200 can have a high on-state current and a low leakage current (off-state current) in a non-conduction state.

In FIG. 2(A), the region 231, the region 232, and the region 234 are formed in the oxide 230b; however, the present invention is not limited thereto. For example, these regions may be formed in the oxide 230a. Furthermore, although the boundaries between the regions are illustrated as being substantially perpendicular to a top surface of the oxide 230b in FIG. 2(A), this embodiment is not limited thereto. For example, in some cases, the region 234 extends toward the conductor 246 (not illustrated) around the surface of the oxide 230b and is narrowed around a bottom surface of the oxide 230b.

To selectively reduce the resistance of the oxide 230b, at least one of an impurity and a metal element that increases conductivity such as indium is added to a desired region. As the impurity, an element that is to form an oxygen vacancy, an element that is to be trapped by an oxygen vacancy, or the like may be used. Examples of the element include hydrogen, boron, carbon, nitrogen, fluorine, phosphorus, sulfur, chlorine, titanium, and a rare gas. Typical examples of the rare gas element include helium, neon, argon, krypton, and xenon.

Thus, when the content percentage of the element that is to form an oxygen vacancy or the element that is to be trapped by an oxygen vacancy in the region 231 is increased, the carrier density can be increased and the resistance can be reduced.

For example, when a conductor functioning as a source electrode or a drain electrode is formed over and in contact with the oxide 230b, the resistance of the oxide 230b is selectively reduced in some cases. On the other hand, the conductor is oxidized through a heat treatment after the formation of the conductor and a thermal history in a step of forming a connection wiring for manufacturing a module, for example. A reduction in the conductivity due to oxidation of the conductor is highly likely to cause changes in the characteristics of a transistor, such as an increase in the resistance with a wiring connected to the conductor, an increase in the voltage required for obtaining the same current amount, or a decrease in an on-state current. Therefore, after the formation of the conductor, the degree of freedom of the deposition temperature for depositing an insulator serving as the first gate insulating film, for example, is limited. Thus, it becomes difficult to reform the insulator to improve the reliability of the semiconductor device.

Furthermore, for example, when the conductor functioning as the source electrode or the drain electrode is formed on the oxide 230b, the conductor functioning as the source electrode and the first gate electrode have a region in which they overlap with each other, and the conductor functioning as the drain electrode and the first gate electrode have a region in which they overlap with each other. Therefore, parasitic capacitance is generated between the conductor serving as the source electrode and the first gate electrode and between the conductor functioning as the drain electrode and the first gate electrode.

Thus, as illustrated in FIG. 1 and FIG. 2(A), the insulator 240 containing an element that is to form an oxygen vacancy or an element that is to be trapped by an oxygen vacancy is formed over the oxide 230b to be in contact with the oxide 230b. With such a structure, the element that is to form an oxygen vacancy or the element that is to be trapped by an oxygen vacancy is added mainly into the region of the oxide 230b in contact with the insulator 240. Accordingly, the element forms oxygen vacancies and enters the oxygen vacancies mainly in the region of the oxide 230b in contact with the insulator 240, which increases the carrier density and reducing the resistance.

When the insulator 240 containing the element is provided instead of the conductors functioning as the source electrode and the drain electrode as described above, the resistance of the oxide 230b can be selectively reduced without the above-described oxidation of the conductors. Thus, an increase in voltage necessary for obtaining the same current amount or a decrease in an on-state current can be prevented. As a result, the deterioration of the transistor characteristics can be inhibited.

Moreover, when the insulator 240 containing the element is provided on the oxide 230b instead of the conductor functioning as the source electrode or the drain electrode, heat treatment can be performed in a step after the insulator 240 is formed. Furthermore, it is unnecessary to take into account a thermal history in a step of forming a connection wiring for manufacturing a module. Therefore, the insulator functioning as the first gate insulating film or the like can be reformed and thus the reliability of the semiconductor device can be improved.

The insulator 240 is provided on the oxide 230b instead of the conductor functioning as the source electrode or the drain electrode, which widens a distance between the low-resistance region of the oxide 230b and the conductor 260 functioning as the first gate electrode. Therefore, parasitic capacitance generated between the low-resistance region of the oxide 230b and the conductor 260 functioning as the first gate electrode can be reduced.

The carrier density of the region 234 functioning as the channel formation region is lowered and the resistance of the region 234 is heightened, whereby the source region and the drain region are prevented from being short-circuited and a semiconductor device with favorable electrical characteristics can be obtained. For example, in the case where an oxide containing excess oxygen is used as the insulator 250, oxygen can be supplied mainly to the region (the region 234) of the oxide 230b in contact with the insulator 250 through heat treatment during or after the formation of the insulator to be the insulator 250. The oxygen is supplied mainly to the region 234, whereby the oxygen vacancies in the region 234 can be filled. The region 234 where oxygen vacancies are filled has a lowered carrier density and a heightened resistance. Such a structure facilitates the formation of the source region or the drain region and the channel formation region that are separated from each other.

A top surface of the insulator 250 is in contact with the insulator 281, for example. For example, when an insulator from which oxygen is released by heating is used as the insulator 281, oxygen released from the insulator 281 by heat treatment or the like passes through the insulator 250 and is added to the region (the region 234) of the oxide 230b in contact with the insulator 250. Therefore, oxygen vacancies in the region 234 are filled, the carrier density is reduced, and the resistance is increased. Such a structure facilitates the formation of the source region or the drain region and the channel formation region that are separated from each other.

<Manufacturing Method of Semiconductor Device>

An example of a method for manufacturing a semiconductor device including the transistor 200 illustrated in FIG. 1 will be described below with reference to FIG. 3 to FIG. 13. Note that figures (A) are top views of the transistor 200 and the neighboring area. Here, figures (B) are cross-sectional views in the channel length direction of the transistor 200 in a portion indicated by a dashed-dotted line A1-A2 in figures (A). Figures (C) are cross-sectional views in the channel width direction of the transistor 200 in a portion indicated by a dashed-dotted line A3-A4 in figures (A).

First, a substrate (not illustrated) is prepared.

As the substrate (not illustrated), an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

A flexible substrate may be used as the substrate. Note that as a method of providing a transistor over a flexible substrate, there is a method in which the transistor is fabricated over a non-flexible substrate and then the transistor is separated and transferred to a substrate which is a flexible substrate. In that case, a separation layer is preferably provided between the non-flexible substrate and the transistor. As the substrate, a sheet, a film, a foil, or the like in which a fiber is weaved may be used. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to the semiconductor device over the substrate, which is caused by dropping or the like, can be reduced. That is, a durable semiconductor device can be provided.

For the substrate which is a flexible substrate, a metal, an alloy, a resin, glass, or a fiber thereof can be used, for example. The substrate which is a flexible substrate preferably has a lower coefficient of linear expansion, which lessens deformation due to an environment. For the substrate which is a flexible substrate, a material whose coefficient of linear expansion is lower than or equal to $1\times10^{-3}$/K, lower than or equal to $5\times10^{-5}$/K, or lower than or equal to $1\times10^{-5}$/K can be used, for example. Examples of the resin include polyester, polyolefin, polyamide (nylon, aramid, or the like), polyimide, polycarbonate, and acrylic. In particular, aramid is preferable for the substrate which is a flexible substrate because of its low coefficient of linear expansion.

Then, the insulator 214 and the insulator 216 are deposited.

The insulator 214 and the insulator 216 can be formed using a sputtering method, a chemical vapor deposition (CVD) method (including a thermal CVD method, a metal organic CVD (MOCVD) method, a plasma-enhanced CVD (PECVD) method, and the like), a molecular beam epitaxy (MBE) method, an atomic layer deposition (ALD) method, a pulsed laser deposition (PLD) method, or the like. In particular, it is preferable that the insulators be deposited by a CVD method, further preferably an ALD method or the like, in which case coverage can be improved. It is preferable to use a thermal CVD method, an MOCVD method, or an ALD method to reduce plasma damage. It is also possible to use a silicon oxide film capable of providing high step coverage that is formed by reacting TEOS (Tetra-Ethyl-Ortho-Silicate), silane, or the like with oxygen, nitrous oxide, or the like.

For example, as the insulator 214, aluminum oxide is formed by a sputtering method. The sputtering method, whose deposition rate is higher than that of the ALD method, can improve the productivity. For example, as the insulator 216, silicon oxynitride is formed by a CVD method. The permittivity of the insulator 216 is preferably lower than that of the insulator 214. When a material with a low permittivity is used for an interlayer film, parasitic capacitance generated between wirings can be reduced.

Then, a groove is formed in the insulator 216 to reach the insulator 214. Examples of the groove include a recessed portion, a hole, and an opening. In forming the groove, wet etching may be employed; however, dry etching is preferable for microfabrication. An insulator that serves as an etching stopper film when the insulator 216 is etched in the formation of the groove is preferably selected as the insulator 214.

After the formation of the groove, a conductive film to be the conductor 205 is deposited. A conductive film to be the conductor 205a is formed in contact with an inner wall of the opening of the insulator 216 and then a conductive film to be the conductor 205b is formed on the inside thereof. The conductive film to be the conductor 205a and the conductive film to be the conductor 205b can be deposited by, for example, a sputtering method, an evaporation method, or a CVD method (including a thermal CVD method, an MOCVD method, a PECVD method, and the like). It is preferable to use a thermal CVD method, an MOCVD method, or an ALD method to reduce plasma damage.

Next, chemical mechanical polishing (CMP) treatment is performed to remove part of the conductive film to be the conductor 205a and part of the conductive film to be the conductor 205b to expose the insulator 216. As a result, the conductive film to be the conductor 205a and the conductive film to be the conductor 205b remain only in the opening portion. Thus, the conductor 205a and the conductor 205b, which have a planar top surface, can be formed (see FIG. 3). Note that the insulator 216 is partly removed by the CMP treatment in some cases.

For the conductor 205, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. In particular, a metal nitride film of tantalum nitride or the like is preferable because such a film has a barrier property against hydrogen or oxygen and is difficult to oxidize (has a high oxidation resistance). Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, tantalum nitride or the like as a conductor with a barrier property against hydrogen is preferably used as the conductor 205a, and tungsten with high conductivity is preferably used as the conductor 205b. The use of the combination can prevent diffusion of hydrogen into the oxide 230 while the conductivity of a wiring is retained. Note that a two-layer structure of the conductor 205a and the conductor 205b is illustrated as the conductor 205 in FIG. 3; however, the structure is not limited thereto and the conductor 205 may have a single-layer structure or a stacked-layer structure of three or more layers. For example, between a conductor having a barrier property and a conductor having high conductivity, a conductor which is highly adhesive to the conductor having a barrier property and the conductor having high conductivity may be formed.

Then, the insulator 220, the insulator 222, and the insulator 224 are deposited. The insulator 224 is preferably an insulator containing oxygen, such as a silicon oxide film or a silicon oxynitride film. It is particularly preferable that an excess-oxygen region be formed in the insulator 224. In the case where an oxide semiconductor is used in an active layer of the transistor, the placement of an insulator including an excess-oxygen region as a peripheral material of the transistor can reduce oxygen vacancies in the oxide semiconductor included in the transistor, thereby improving the reliability.

Specifically, as the insulator including an excess-oxygen region, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, more preferably greater than or equal to $2.0\times10^{19}$ atoms/cm$^3$, or greater than or equal to $3.0\times10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

When the insulator 224 includes an excess-oxygen region, the insulator 222 preferably has a barrier property against oxygen (e.g., an oxygen atom or an oxygen molecule), hydrogen (e.g., a hydrogen atom or a hydrogen molecule) and water. When the insulator 222 has a barrier property against oxygen, oxygen in the excess-oxygen region is not diffused downward from the insulator 222 but can be supplied to the oxide 230 efficiently. Furthermore, the conductor 205 can be inhibited from reacting with oxygen from the excess-oxygen region included in the insulator 224.

In the case where the insulator 224 includes an excess-oxygen region, for example, the insulator 220 and the insulator 222 are not necessarily provided when a conductor having a barrier property is formed over the conductor 205. The conductor with a barrier property can inhibit the conductor 205 from reacting with oxygen from the excess-oxygen region and from generating an oxide.

The insulator 220, the insulator 222, and the insulator 224 can be formed using materials and methods similar to those used for forming the insulator 214 or the insulator 216.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) is preferably used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

It is preferable that the insulator 220 be thermally stable. Because silicon oxide and silicon oxynitride are thermally stable, combination of silicon oxide or silicon oxynitride with an insulator of a high-k material can constitute a stacked-layer structure that is thermally stable and has a high dielectric constant, for example.

For example, as the insulator 222, aluminum oxide is formed by an ALD method. When an insulating layer is formed by an ALD method, a dense insulating layer with a smaller number of defects such as cracks and pinholes or with a uniform thickness can be formed. For example, as each of the insulator 220 and the insulator 224, a silicon oxynitride film is formed by a CVD method. Note that the insulator 224 is preferably an insulating layer containing excess oxygen. Furthermore, oxygen doping treatment may be performed after the formation of the insulator 224.

Note that the insulator 220, the insulator 222, and the insulator 224 are preferably deposited successively. By the successive deposition, impurities do not attach to the interfaces between the insulator 220 and the insulator 222 and between the insulator 222 and the insulator 224, resulting in the formation of highly reliable insulators.

Heat treatment may be performed after the deposition of the insulator 224. The heat treatment is performed at 400° C. in an atmosphere containing nitrogen for one hour, for example. By the heat treatment, impurities such as hydrogen and water contained in the insulator 224 can be removed.

Note that the insulator 220, the insulator 222, and the insulator 224 may each have a stacked-layer structure of two or more layers. In that case, without limitation to a stacked-layer structure formed of the same material, a stacked-layer structure formed of different materials may be employed.

Next, an oxide film 230A to be the oxide 230a and an oxide film 230B to be the oxide 230b are deposited in this order over the insulator 224. Note that the oxides are preferably deposited successively without exposure to an air atmosphere. By the deposition without exposure to the air, impurities or moisture from the air atmosphere can be prevented from being attached to the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Raising the proportion of oxygen contained in the sputtering gas can increase the amount of excess oxygen in the deposited oxide films. In the case where the above oxide films are deposited by a sputtering method, the above-mentioned In-M-Zn oxide target can be used.

In particular, part of oxygen contained in the sputtering gas is supplied to the insulator 224 during the deposition of the oxide film 230A in some cases. Therefore, the proportion of oxygen contained in the sputtering gas for the oxide film 230A is preferably 70% or higher, further preferably 80% or higher, still further preferably 100%. When an oxide containing excess oxygen is used for the oxide film 230A, oxygen can be supplied to the oxide 230b by later heat treatment.

In the case where the oxide film 230B is formed by a sputtering method with a sputtering gas in which a proportion of oxygen is set to 1% or higher and 30% or lower, preferably 5% or higher and 20% or lower, an oxygen-deficient oxide semiconductor is formed. A transistor in which an oxygen-deficient oxide semiconductor is used for its channel formation region can have relatively high field-effect mobility.

In this embodiment, the oxide film 230A is deposited by a sputtering method using a target with In:Ga:Zn=1:3:4 [atomic ratio]. The oxide film 230B is deposited by a sputtering method using a target with In:Ga:Zn=4:2:4.1 [atomic ratio]. Note that each of the oxide films is formed to have characteristics required for the oxide 230 by an appropriately selected deposition condition and atomic ratio.

Next, heat treatment may be performed. For the heat treatment, the above-mentioned heat treatment conditions can be used. Through the heat treatment, impurities such as water and hydrogen in the oxide film 230A and the oxide film 230B can be removed, for example. In this embodiment, treatment is performed at 400° C. in a nitrogen atmosphere for one hour, and successively other treatment is performed at 400° C. in an oxygen atmosphere for one hour.

Figure 3A:
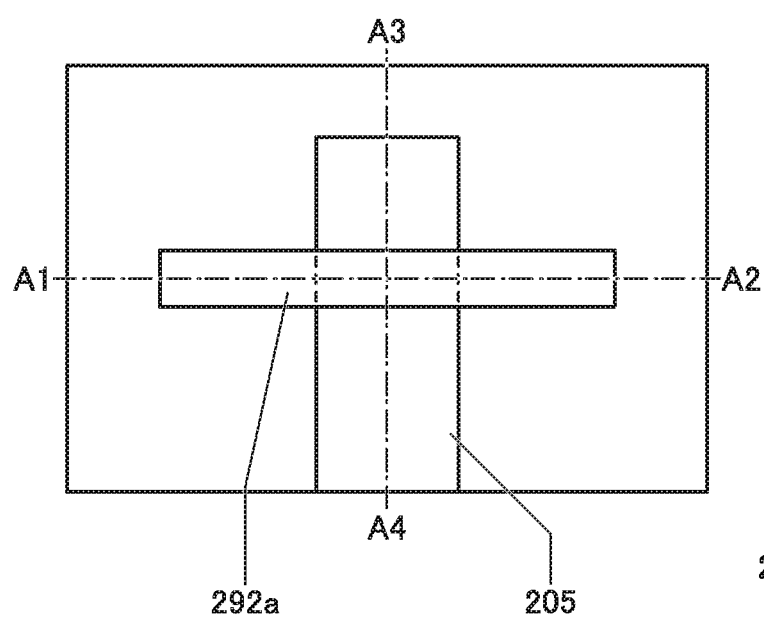
FIG. 3 A top view and cross-sectional views illustrating a method for manufacturing a semiconductor device of one embodiment of the present invention.
Figure 3C:
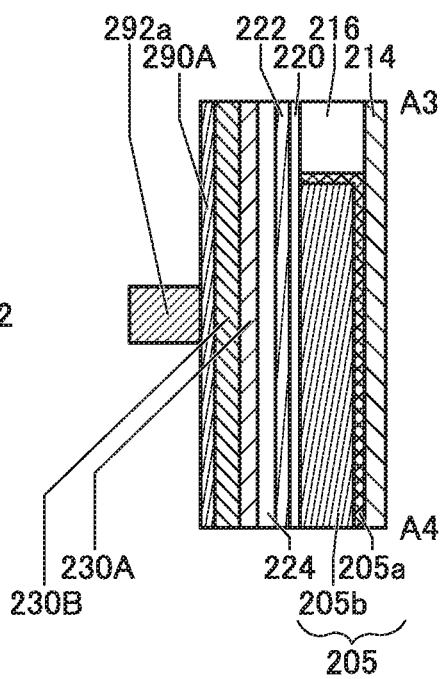
Figure 3B:
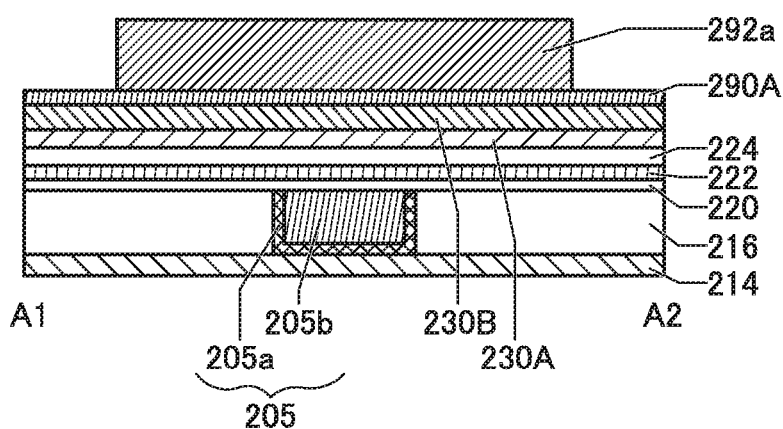

Next, a film 290A to be a hard mask is formed (see FIG. 3). For example, tungsten is deposited by a sputtering method as the film 290A.

Next, a resist mask 292a is formed over the film 290A by a photolithography method (see FIG. 3). The resist mask is formed by a lithography method or the like.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. An electron beam or an ion beam may be used instead of the above-mentioned light. Note that a mask is unnecessary in the case of using an electron beam or an ion beam. The resist mask can be removed by dry etching treatment such as ashing, wet etching treatment, dry etching treatment plus wet etching treatment, or wet etching treatment plus dry etching treatment.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate type electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Part of the film 290A is selectively removed with the use of the resist mask 292a, so that an island-shaped hard mask (not illustrated) is formed. After that, the resist mask 292a is removed by ashing or with a resist stripper.

Then, part of the oxide film 230A and part of the oxide film 230B are selectively removed with the use of the above hard mask. In this step, part of the insulator 224 is concurrently removed in some cases. Through this step, the island-shaped oxide 230a and the island-shaped oxide 230b can be formed. Then, the hard mask is removed (see FIG. 4).

Figure 5A:
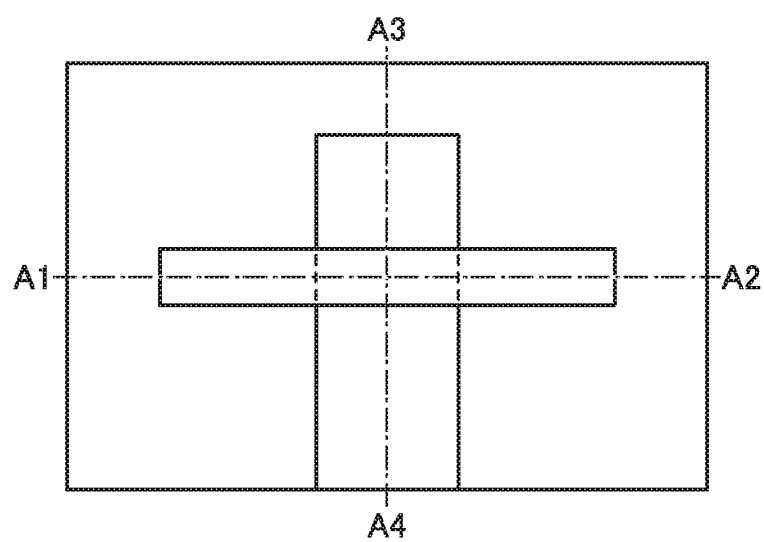
FIG. 5 A top view and cross-sectional views illustrating a method for manufacturing a semiconductor device of one embodiment of the present invention.
Figure 5C:
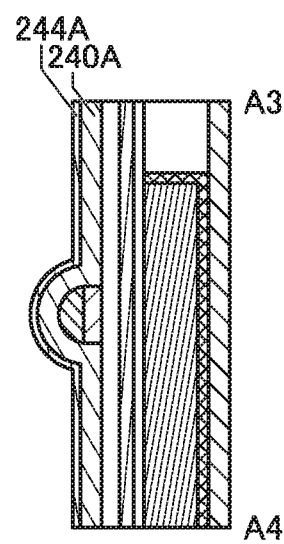

Next, an insulating film 240A to be the insulator 240 and a barrier film 244A are formed (see FIG. 5).

For the insulating film 240A, a film containing an element other than main components of the oxide 230b, such as nitrogen or hydrogen, can be used. Specifically, silicon nitride, silicon nitride oxide, silicon oxynitiride, or the like can be used. It is particularly preferable to use silicon nitride formed by a CVD method. When silicon nitride is used for the insulating film 240A, the element that is to form an oxygen vacancy or the element that is to be trapped by an oxygen vacancy is added to the oxide 230b. Accordingly, the carrier density of the oxide 230b is increased and the resistance thereof is decreased. Note that the element that is to form an oxygen vacancy or the element that is to be trapped by an oxygen vacancy may also be added to the oxide 230a.

Figure 2B:
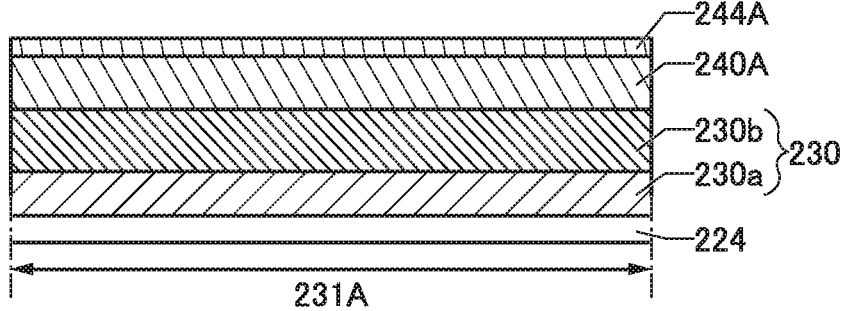
Figure 5B:
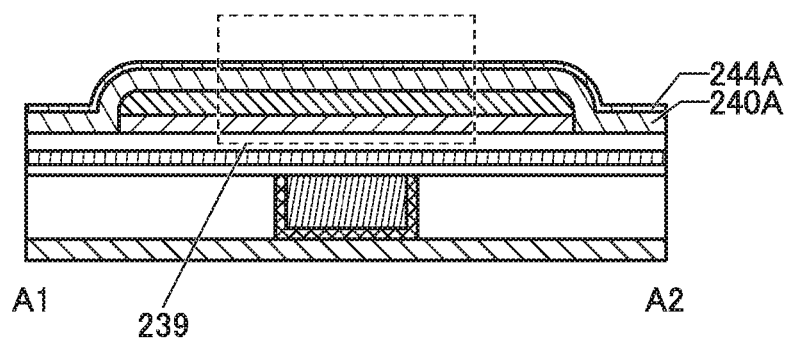

Here, an enlarged view of a region 239 surrounded by a dashed line in FIG. 5(B) is illustrated in FIG. 2(B). The insulating film 240A is in contact with the oxide 230b as illustrated in FIG. 2(B), so that the element that is to form an oxygen vacancy or the element that is to be trapped by an oxygen vacancy in the oxide 230b is added to the oxide 230b. Thus, oxygen vacancies are formed in the oxide 230b and the resistance of the entire surface is reduced. In other words, the low-resistance region 231A extends over the entire oxide 230b.

As the barrier film 244A, aluminum oxide is formed by an ALD method, for example. With the use of an ALD method, a dense film with a smaller number of defects such as cracks and pinholes or with a uniform thickness can be formed.

Figure 6A:
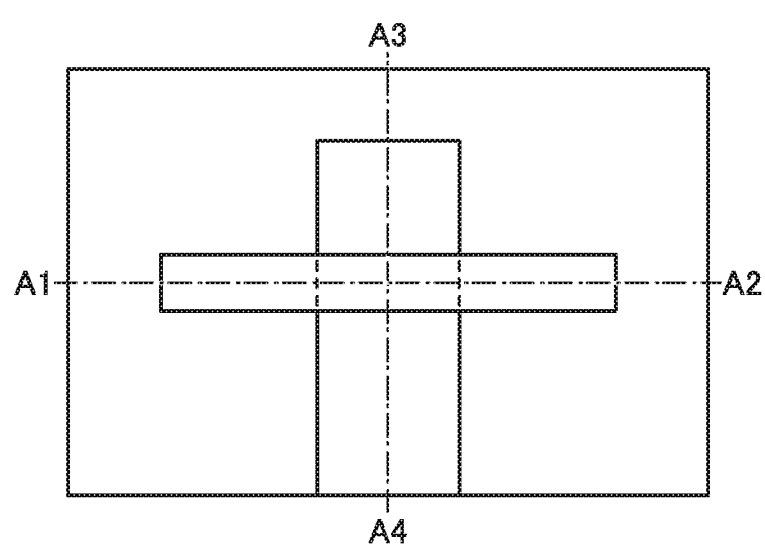
FIG. 6 A top view and cross-sectional views illustrating a method for manufacturing a semiconductor device of one embodiment of the present invention.
Figure 6C:
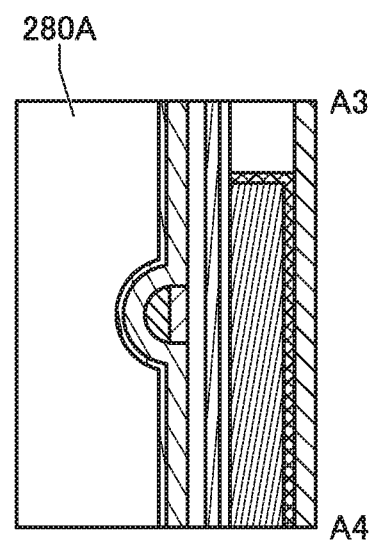
Figure 6B:
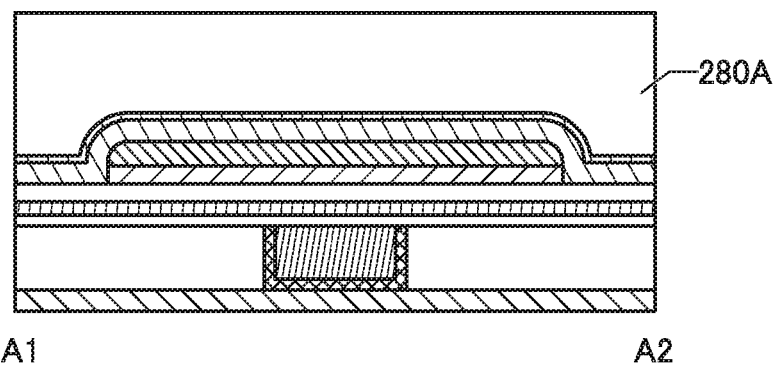
Figure 7A:
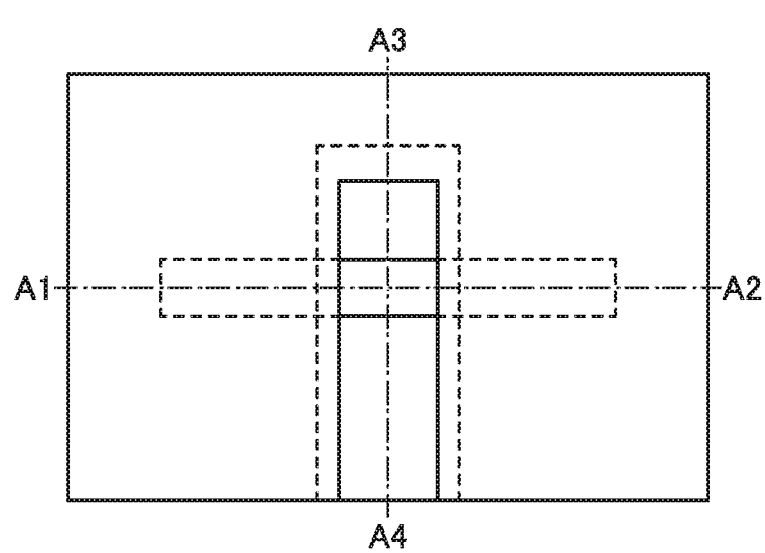
FIG. 7 A top view and cross-sectional views illustrating a method for manufacturing a semiconductor device of one embodiment of the present invention.
Figure 7C:
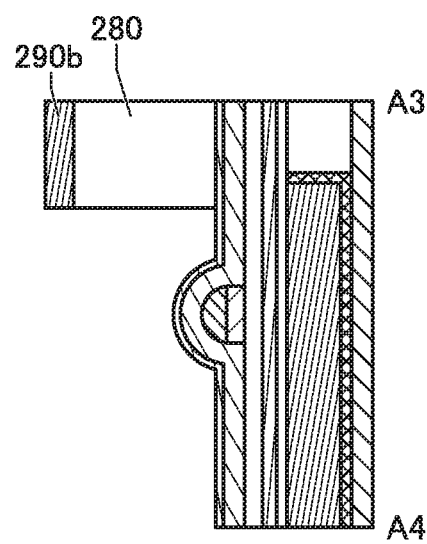
Figure 7B:
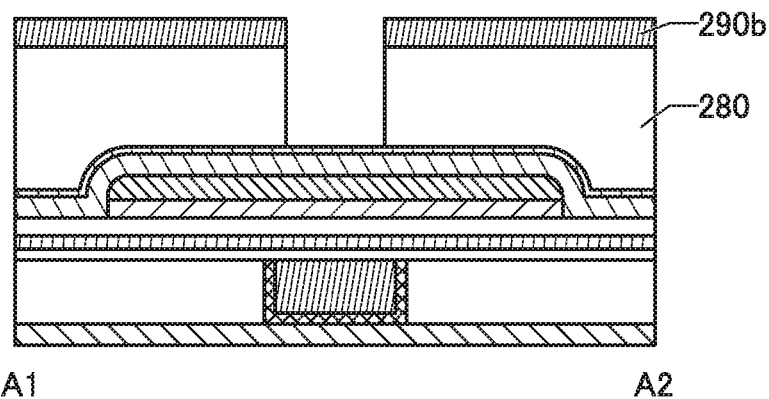

Next, an insulating film 280A to be the insulator 280 is formed over the barrier film 244A (FIG. 6). After the insulating film 280A is deposited, planarization treatment using a CMP method or the like may be performed to improve the planarity of the top surface thereof.

As the insulator 280, an insulator containing oxygen, such as a silicon oxide film or a silicon oxynitride film, is formed by a CVD method, for example. When a material with a relatively low dielectric constant is used for an interlayer film, parasitic capacitance generated between wirings can be reduced.

Then, a film to be a hard mask (not illustrated) is deposited over the insulating film 280A. As the film, tungsten is formed by a sputtering method, for example.

Then, a resist mask (not illustrated) is formed over the film to be a hard mask by a photolithography method.

Next, part of the film to be a hard mask is removed using the resist mask as a mask, whereby a hard mask 290b is formed. Next, an opening that reaches the barrier film 244A is formed in the insulating film 280A with the use of the hard mask 290b, whereby the insulator 280 having the opening is formed (see FIG. 7). In this step, the resist mask may be etched away.

Figure 8A:
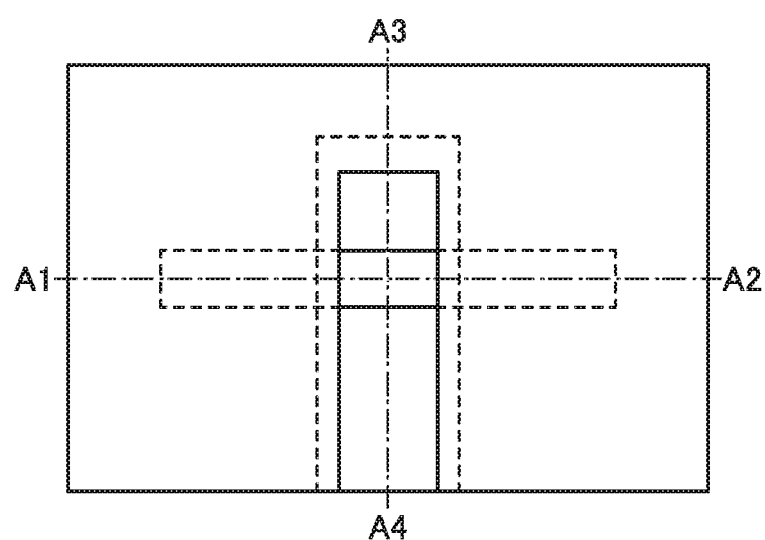
FIG. 8 A top view and cross-sectional views illustrating a method for manufacturing a semiconductor device of one embodiment of the present invention.
Figure 8C:
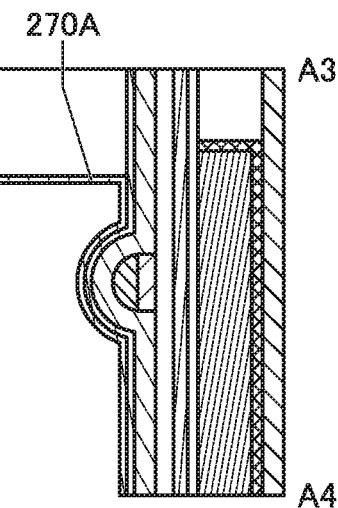
Figure 8B:
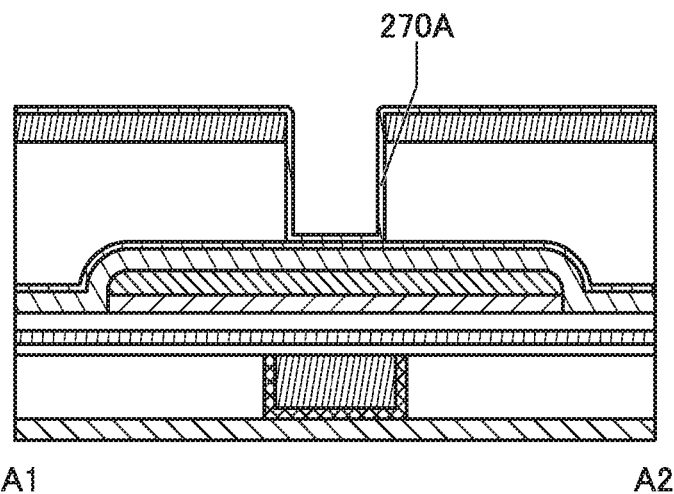
Figure 9A:
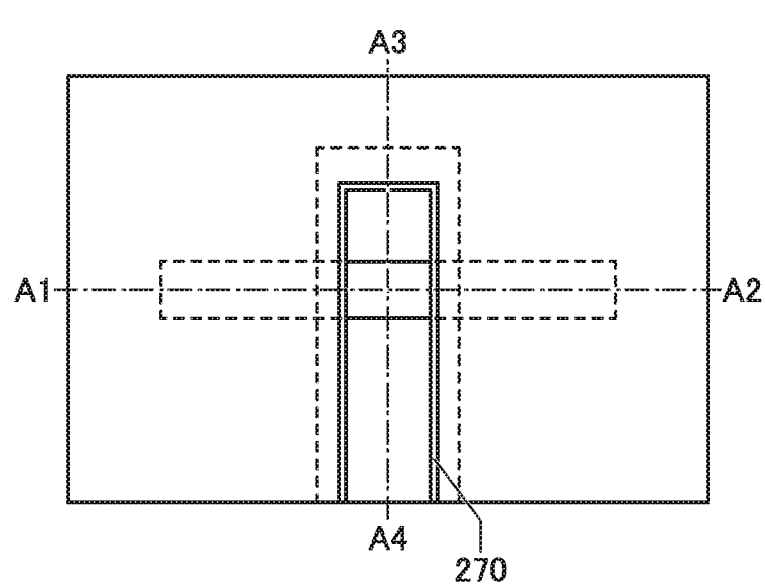
FIG. 9 A top view and cross-sectional views illustrating a method for manufacturing a semiconductor device of one embodiment of the present invention.
Figure 9C:
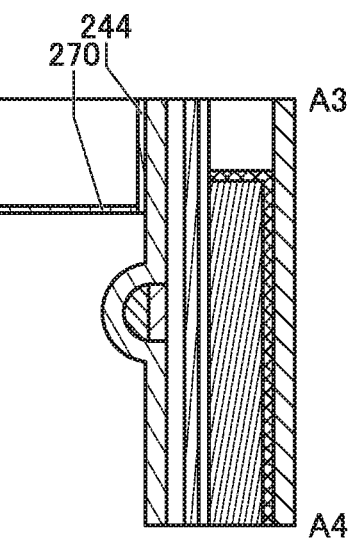
Figure 9B:
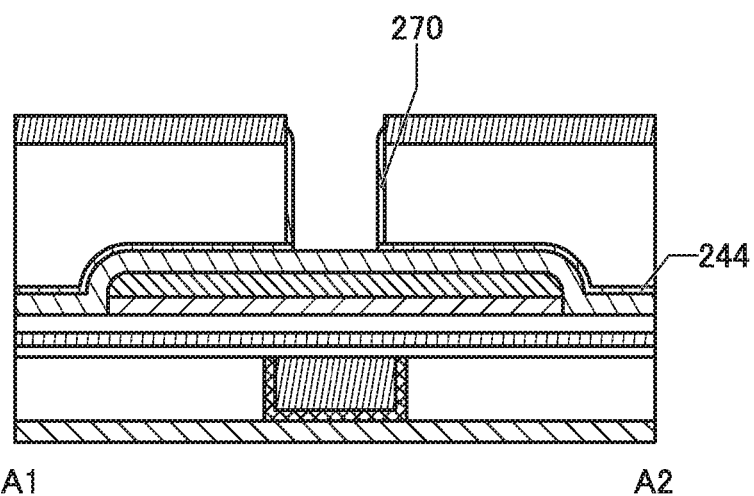
Figure 10A:
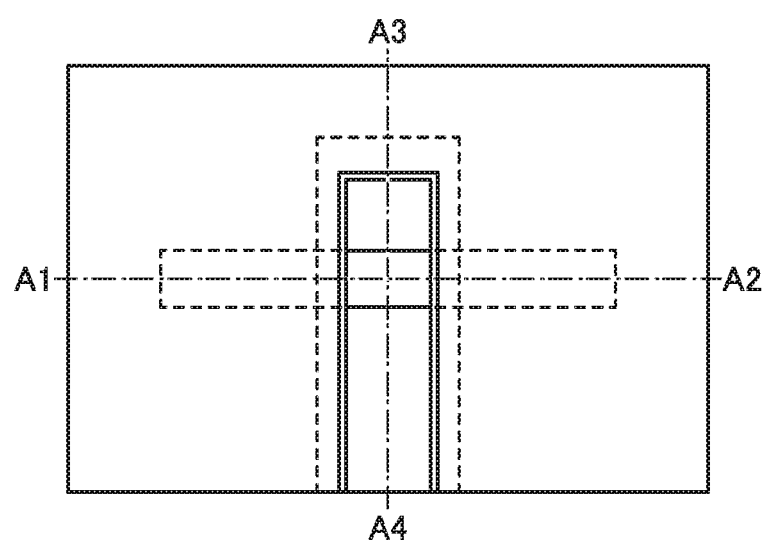
FIG. 10 A top view and cross-sectional views illustrating a method for manufacturing a semiconductor device of one embodiment of the present invention.
Figure 10C:
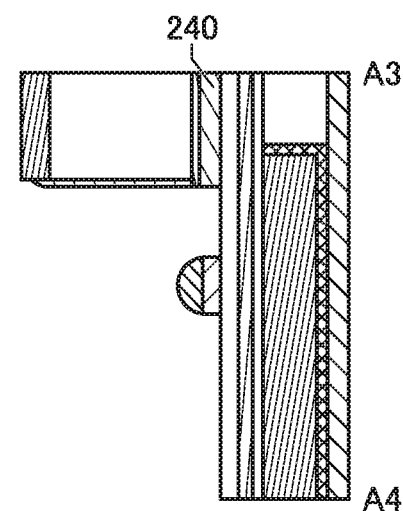
Figure 10B:
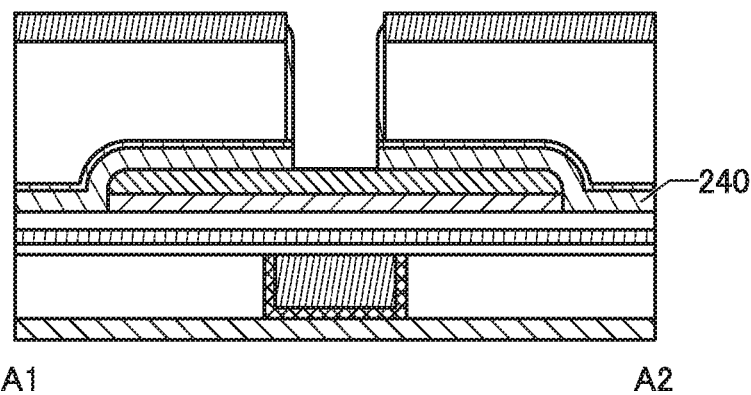
Figure 12A:
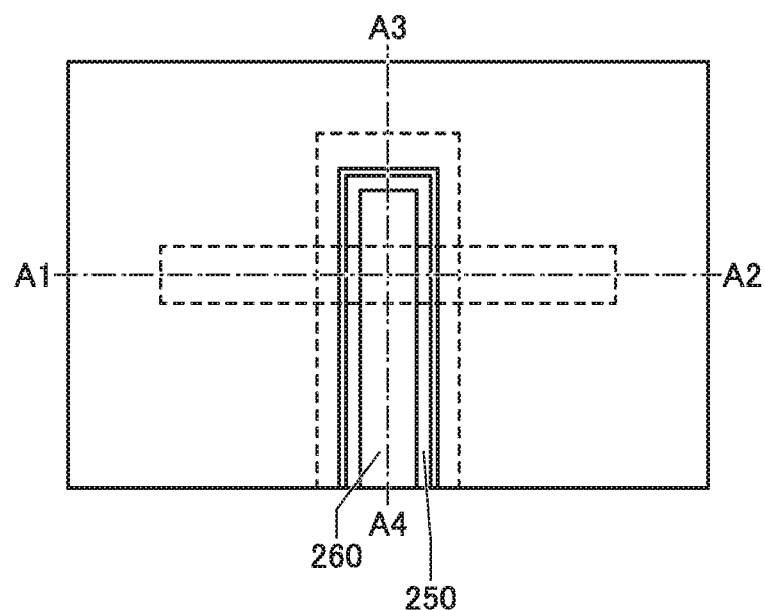
FIG. 12 A top view and cross-sectional views illustrating a method for manufacturing a semiconductor device of one embodiment of the present invention.
Figure 12C:
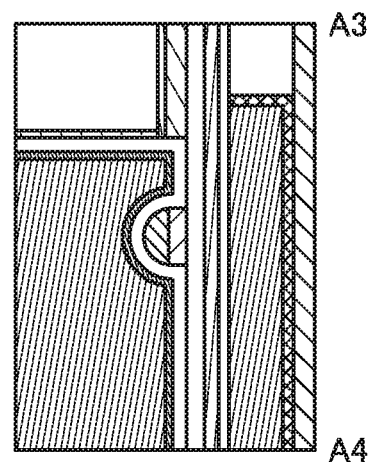
Figure 12B:
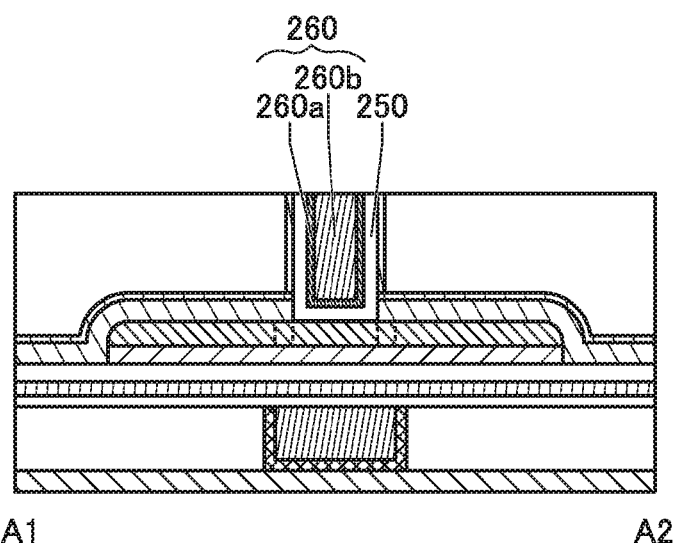

Next, a barrier film 270A is deposited over the hard mask 290b and in contact with an inner wall of the opening (see FIG. 8). Here, for the barrier film 270A, a material that is less likely to transmit oxygen is preferably used, and for example, aluminum oxide formed by an ALD method can be used.

Then, part of the barrier film 270A and part of the barrier film 244A are removed. For example, etch-back treatment is performed until the insulating film 240A is exposed, so that the barrier film 270 and the barrier film 244 can be formed (see FIG. 9).

The barrier film 270 can prevent excess oxygen contained in an insulating film 250A formed in a later step from diffusing into the insulator 280. Thus, excess oxygen contained in the insulating film 250A can be efficiently supplied to the region 234 of the oxide 230b.

Then, plasma treatment is performed until the oxide 230b is exposed, so that part of the insulating film 240A is removed. In this way, the insulator 240 can be formed (see FIG. 10).

Next, the insulating film 250A to be the insulator 250 is deposited (see FIG. 11).

Note that the insulating film 250A is preferably an insulating film containing excess oxygen. It is preferable to form silicon oxynitride by a CVD method as the insulating film 250A, for example. Moreover, the insulating film 250A may be subjected to oxygen doping treatment. Furthermore, heat treatment may be performed after the formation of the insulating film 250A.

Figure 2C:
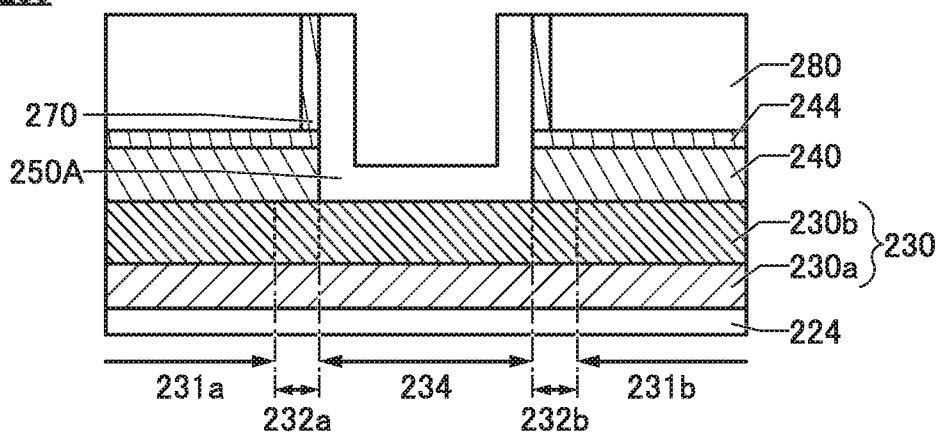

Here, an enlarged view of the region 239 surrounded by a dashed line in FIG. 11(B) is illustrated in FIG. 2(C). The insulating film 250A containing excess oxygen is provided as illustrated in FIG. 2(C), whereby oxygen is supplied to the region 234 of the oxide 230b in contact with the insulating film 250 A. Accordingly, oxygen vacancies formed in the region 234 of the oxide 230b are filled, so that the resistance of the region 234 in the oxide 230b is increased. On the other hand, the resistance of the region 231a and the region 231b of the oxide 230b, which are not in contact with the insulating film 250A, is kept low. Thus, it is easy to form the region 231a and the region 231b with low resistance and the region 234 with high resistance that are separated from each other. In addition, between the region 234 and the region 231a and between the region 234 and the region 231b, the region (junction region) 232 whose carrier density is lower than that of the region 231 and higher than that of the region 234 may be provided.

When the insulating film 250A containing excess oxygen is provided as illustrated in FIG. 11(C), oxygen can also be supplied to the insulator 224. If the insulator 240 is formed over the insulator 224, excess oxygen in the insulator 224 is diffused into the insulator 240 and the insulator 224 is brought into an oxygen-deficient state in some cases. When part of the insulator 240 over the insulator 224 is removed and the insulating film 250A is provided over the insulator 224, oxygen in the insulating film 250A can be supplied to the insulator 224. Therefore, oxygen can be supplied to the bottom surface side of the oxide 230a, so that oxygen vacancies formed in the oxide 230a are filled and the resistance of the oxide 230a is increased in some cases.

Note that the insulating film 250A may have a stacked-layer structure of two or more layers. The insulating film containing excess oxygen and the insulating film having a barrier property against oxygen or hydrogen may be stacked, for example. With such a structure, it is possible to prevent diffusion of excess oxygen contained in the insulating film 250A into the conductor 260 formed in a later step. Thus, excess oxygen contained in the insulating film 250A can be efficiently supplied to the region 234 of the oxide 230b. In addition, hydrogen as an impurity in the conductor 260 formed in a later step and part of elements included in the conductor 260 can be inhibited from diffusing into the outside. Furthermore, the conductor 260 can be inhibited from serving as a diffusion path of hydrogen as an impurity from the transistor or the outside.

Next, a conductive film to be the conductor 260a and a conductive film to be the conductor 260b are deposited. The conductive film to be the conductor 260a and the conductive film to be the conductor 260b can be formed using materials and methods similar to those for the conductor 205a and the conductor 205b. As the conductive film to be the conductor 260a, titanium nitride is formed by a sputtering method, for example. As the conductive film to be the conductor 260b, tungsten is formed by a sputtering method, for example.

Next, unnecessary portions of the conductive film to be the conductor 260b, the conductive film to be the conductor 260a, and the insulating film 250A are removed. For example, part of the conductive film to be the conductor 260b, part of the conductive film to be the conductor 260a, part of the insulating film 250A, and the hard mask 290b are removed by etch-back treatment, CMP treatment, or the like until the insulator 280 is exposed, whereby the conductor 260 (the conductor 260a and the conductor 260b) and the insulator 250 are formed (see FIG. 12). Note that although the transistor 200 has a structure in which two layers of the conductor 260a and the conductor 260b are stacked in the illustration, the structure is not limited thereto, and a single-layer structure or a stacked-layer structure of three or more layers may be used.

Through the above process, the transistor 200 of one embodiment of the present invention can be manufactured.

Figure 13A:
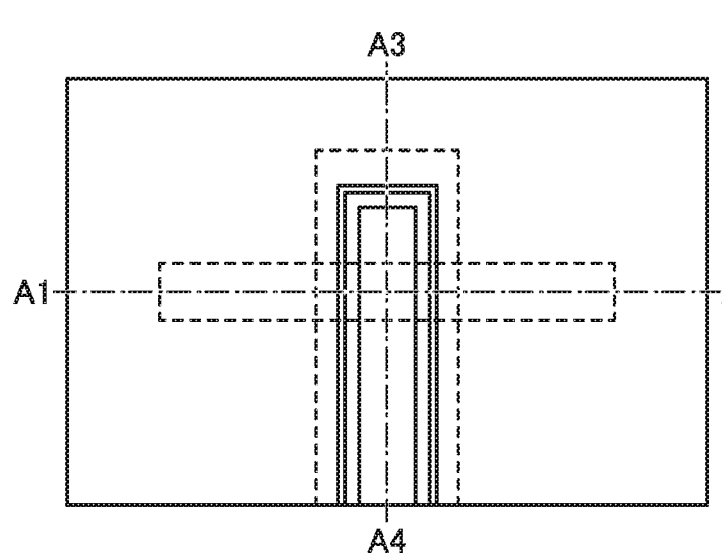
FIG. 13 A top view and cross-sectional views illustrating a method for manufacturing a semiconductor device of one embodiment of the present invention.
Figure 13C:
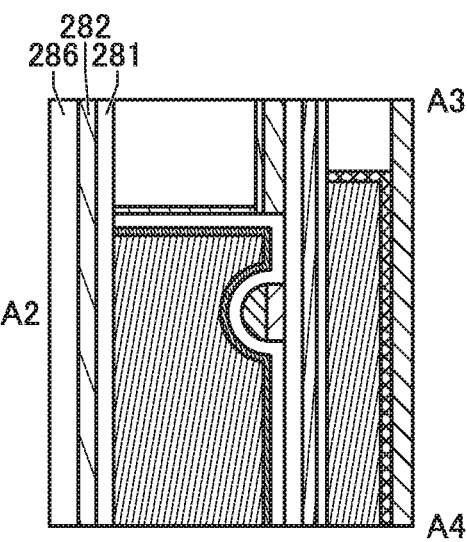
Figure 13B:
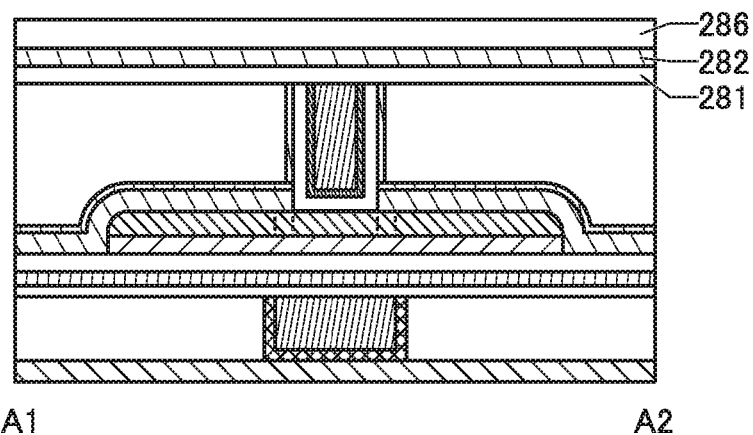

Next, the insulator 281, the insulator 282, and the insulator 286 are deposited in this order over the insulator 280, the barrier film 270, the insulator 250, and the conductor 260 (see FIG. 13).

The insulator 281 is an insulator containing oxygen, such as a silicon oxide film or a silicon oxynitride film. As a method for forming an insulator containing excess oxygen, a silicon oxide film or a silicon oxynitride film containing a large amount of oxygen can be formed by a CVD method or a sputtering method under deposition conditions that are set as appropriate.

Note that, to make the insulator 281 contain oxygen in excess, the insulator 281 may be deposited in an oxygen atmosphere, for example. Alternatively, a region containing oxygen in excess may be formed by introducing oxygen into the insulator 281 that has been deposited, and both the methods may be used in combination.

For example, oxygen (at least including any of oxygen radicals, oxygen atoms, and oxygen ions) is introduced into the insulator 281 that has been deposited, whereby a region containing oxygen in excess is formed. As a method for introducing oxygen, an ion implantation method, an ion doping method, a plasma immersion ion implantation method, plasma treatment, or the like can be used.

A gas containing oxygen can be used for the oxygen introduction treatment. As a gas containing oxygen, oxygen, dinitrogen monoxide, nitrogen dioxide, carbon dioxide, carbon monoxide, or the like can be used. A rare gas may be contained in the gas containing oxygen in the oxygen introduction treatment; for example, a mixed gas of carbon dioxide, hydrogen, and argon can be used.

Introduction of excess oxygen into the insulator 281 can form an excess-oxygen region. The excess oxygen in the insulator 281 can be supplied mainly to the region 234 of the oxide 230b through the insulator 250 to fill oxygen vacancies in the region 234 of the oxide 230b.

Note that the insulator 281 is not necessarily deposited in some cases. For example, when the insulator 250 includes a sufficient amount of excess oxygen to fill oxygen vacancies formed in the region 234 of the oxide 230b, the insulator 281 is not necessarily provided.

The insulator 282 is preferably deposited with a sputtering apparatus. By using a sputtering method, an excess-oxygen region can be formed easily in the insulator 281 which is a lower layer of the insulator 282.

During the deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The relationship between the potentials is $E_2 > E_1 > E_0$.

The ions in plasma are accelerated by a potential difference $E_2 - E_0$ and collide with the target, whereby the sputtered particles are ejected from the target. These sputtered particles are attached on a deposition surface and deposited thereover; as a result, a film is deposited. In addition, some ions recoil by the target and might be taken, as recoil ions, into the insulator 281 below the formed film, through the formed film. The ions in the plasma are accelerated by a potential difference $E_2 - E_1$ and collide with the deposition surface. At that time, some ions of the ions reach the inside of the insulator 281. The ions are taken into the insulator 281; accordingly, a region into which the ions are taken is formed in the insulator 281. That is, an excess-oxygen region is formed in the insulator 281 in the case where the ions include oxygen.

Accordingly, when the deposition in an oxygen gas atmosphere with a sputtering apparatus is performed as means for depositing the insulator 282, oxygen can be introduced into the insulator 281 while the insulator 282 is deposited. When aluminum oxide having a barrier property is used for the insulator 282, for example, excess oxygen introduced into the insulator 281 can be effectively confined on the transistor 200 side.

As the insulator 286, an insulator containing oxygen, such as a silicon oxide film or a silicon oxynitride film, is formed by a CVD method, for example. The permittivity of the insulator 286 is preferably lower than that of the insulator 282. When a material with a low permittivity is used for an interlayer film, parasitic capacitance generated between wirings can be reduced.

Next, a film to be a hard mask (not illustrated) is formed over the insulator 286. As the film, tungsten is formed by a sputtering method, for example.

Next, a resist mask (not illustrated) is formed over the film by a photolithography method.

Next, a hard mask is formed by removing part of the film with the use of the resist mask. Then, an opening that reaches the insulator 240 is formed in the insulator 286, the insulator 282, the insulator 281, the insulator 280, and the barrier film 244 with the use of the hard mask. In this step, the resist mask may be etched away.

Next, a barrier film (not illustrated) is deposited over the hard mask and in the opening. As the barrier film, aluminum oxide is formed by an ALD method, for example.

Then, part of a region of the barrier film that is in contact with the insulator 240 is removed. For example, etch-back treatment is performed until the insulator 240 is exposed, so that the barrier film 276a and the barrier film 276b illustrated in FIG. 1(B) can be formed.

By providing the barrier film 276a and the barrier film 276b, hydrogen as an impurity in the conductor 246 (the conductor 246a and the conductor 246b) and the conductor 248 (the conductor 248a and the conductor 248b) formed in later steps and some elements included in the conductor 246 and the conductor 248 can be inhibited from diffusing into the outside. The conductor 246 and the conductor 248 can be inhibited from serving as a diffusion path of hydrogen as an impurity from the transistor or the outside.

Then, plasma treatment is performed until the oxide 230b is exposed, so that part of the insulator 240 is removed.

Next, a conductive film to be the conductor 246 (the conductor 246a and the conductor 246b) and a conductive film to be the conductor 248 (the conductor 248a and the conductor 248b) are deposited. For example, the conductive film to be the conductor 246 and the conductive film to be the conductor 248 can be deposited by a sputtering method, a CVD method, an MBE method, a PLD method, an ALD method, or the like. The conductive film to be the conductor 246 and the conductive film to be the conductor 248 are deposited to fill the opening formed in the insulator 280 and the like. Therefore, a CVD method (in particular, an MOCVD method) is preferably used. In some cases, a multilayer film of a conductor deposited by an ALD method or the like and a conductor deposited by a CVD method is preferred to increase adhesion of the conductor deposited by an MOCVD method. For example, titanium nitride is deposited as the conductive film to be the conductor 246, and tungsten is deposited as the conductive film to be the conductor 248.

Then, unnecessary portions of the conductive film to be the conductor 246 and the conductive film to be the conductor 248 are removed. For example, part of the conductive film to be the conductor 246, part of the conductive film to be the conductor 248, and the hard mask are removed by etch-back treatment, CMP treatment, or the like until the insulator 286 is exposed, whereby the conductor 246 and the conductor 248 are formed. At this time, the insulator 286 can be used as a stopper layer, and the thickness of the insulator 286 may be reduced.

Note that the semiconductor device described in this embodiment has the structure in which the conductor 246 is in contact with a top surface of the low-resistance region of the oxide 230b functioning as the source region or the drain region through the opening formed in the insulator 280, the barrier film 244, and the insulator 240; however, the structure is not limited thereto. For example, a structure may be employed in which the conductor 246 is in contact with the top surface and a side surface of the low-resistance region of the oxide 230b.

Through the above process, the semiconductor device including the transistor 200 illustrated in FIG. 1 can be manufactured.

<Metal Oxide>

The oxide 230 is preferably formed using a metal oxide functioning as a semiconductor (hereinafter also referred to as an oxide semiconductor). A metal oxide that can be used for the oxide 230 of the present invention will be described below.

The metal oxide preferably contains at least indium or zinc. In particular, indium and zinc are preferably contained. Aluminum, gallium, yttrium, tin, or the like is preferably contained in addition to them. One kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include CAAC-OS (a c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

Modification Example 1 of Transistor

The transistor 200 described in this embodiment is not limited to that shown in FIG. 1. A modification example of the transistor 200 shown in this embodiment is described below with reference to FIG. 14. In the following description, for the components that are denoted by the same reference numerals as those of the transistor 200, the corresponding description of the transistor 200 can be referred to.

FIG. 14(A) is a top view of a transistor 200a, FIG. 14(B) is a cross-sectional view taken along the dashed-dotted line A1-A2 in FIG. 14(A), and FIG. 14(C) is a cross-sectional view taken along the dashed-dotted line A3-A4 in FIG. 14(A).

The transistor 200a illustrated in FIG. 14 is different from the transistor 200 illustrated in FIG. 1 in that the thickness of the region 234 of the oxide 230b is smaller than that of the region 231 of the oxide 230b.

The path through which carriers flow is extended with a reduced thickness of the region 234 functioning as a channel formation region of the transistor 200a. Accordingly, a longer effective L length can inhibit a short-channel effect.

Furthermore, part of the region 232 of the oxide 230b is in contact with the insulator 250 formed in a later step, whereby excess oxygen contained in the insulator 250 is supplied to the region 234 and the region 232 of the oxide 230b. The amount of excess oxygen supplied to the region 232 is larger than that supplied to the region 231 that is not in contact with the insulator 250 and less than that supplied to the region 234; thus, the carrier density of the region 232 is lower than that of the region 231 and higher than that of the region 234. That is, the region 232 functions as a junction region between the channel formation region and the source region or the drain region. By providing the junction region, a high-resistance region is not formed between the region 231 and the region 234 and the on-state current of the transistor 200a can be increased.

Next, a method for manufacturing the transistor 200a illustrated in FIG. 14 is described. The method for manufacturing the transistor 200a is the same as the method for manufacturing the transistor 200 up to the step of forming the barrier film 270 and the barrier film 244 illustrated in FIG. 9.

Then, in the plasma treatment by which part of the insulating film 240A is removed to form the insulator 240, part of the oxide 230b is also removed. The part of the oxide 230b is removed, so that the thickness of the region 234 of the oxide 230b can be reduced.

Next, the insulating film 250A to be the insulator 250 is deposited. The method for manufacturing the transistor 200a after the step of depositing the insulating film 250A is the same as the method for manufacturing the transistor 200.

Through the above process, the transistor 200a can be manufactured.

Modification Example 2 of Transistor

A modification example of the transistor 200 shown in this embodiment is described below with reference to FIG. 15. In the following description, for the components that are denoted by the same reference numerals as those of the transistor 200, the corresponding description of the transistor 200 can be referred to.

FIG. 15(A) is a top view of a transistor 200b, FIG. 15(B) is a cross-sectional view taken along the dashed-dotted line A1-A2 in FIG. 15(A), and FIG. 15(C) is a cross-sectional view taken along the dashed-dotted line A3-A4 in FIG. 15(A).

The transistor 200b illustrated in FIG. 15 is different from the transistor 200 illustrated in FIG. 1 in that the barrier film 270 is in contact with side surfaces of the insulator 280, the barrier film 244, and the insulator 240.

Since the barrier film 270 is in contact with the side surface of the insulator 240, excess oxygen in the insulator 250 can be inhibited from diffusing into the insulator 240 and can be supplied to the oxide 230b efficiently.

Next, a method for manufacturing the transistor 200b illustrated in FIG. 15 is described. The manufacturing method of the transistor 200b is the same as the manufacturing method of the transistor 200 up to the step of forming the insulator 280 having the opening reaching the barrier film 244A illustrated in FIG. 7.

For the transistor 200b, the barrier film 244A and the insulating film 240A are partly removed in the opening, whereby an opening that reaches the oxide 230b is formed.

Then, the barrier film 270A is formed over the hard mask 290b and in the opening.

Then, part of a region of the barrier film 270A that is in contact with the oxide 230b is removed. For example, etch-back treatment is performed until the oxide 230b is exposed.

Note that part of the oxide 230b may be also removed when the above treatment is performed. When the part of the oxide 230b is removed, the thickness of the region of the oxide 230b in contact with the insulator 250 is reduced. Since the region functions as a channel formation region of the transistor 200b, a reduction in the thickness of the region can inhibit a short-channel effect.

Next, the insulating film 250A to be the insulator 250 is deposited. The method for manufacturing the transistor 200b after the step of depositing the insulating film 250A is the same as the method for manufacturing the transistor 200.

Through the above process, the transistor 200b can be manufactured.

Modification Example 3 of Transistor

A modification example of the transistor 200 shown in this embodiment is described below with reference to FIG. 16. In the following description, for the components that are denoted by the same reference numerals as those of the transistor 200, the corresponding description of the transistor 200 can be referred to.

Figure 16A:
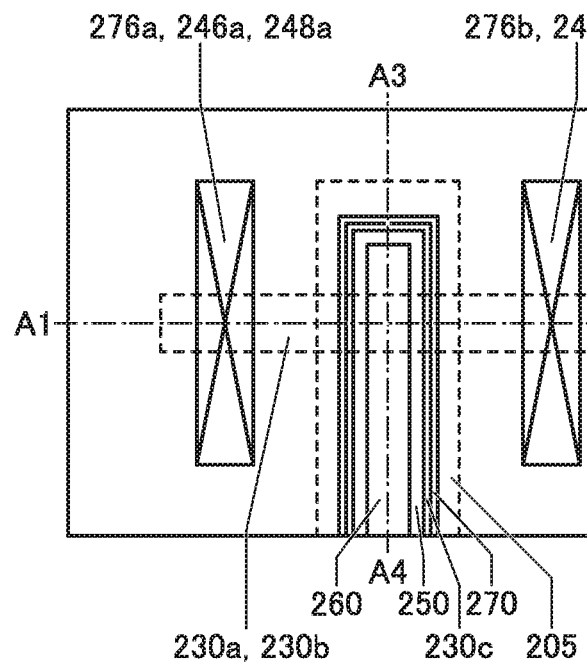
FIG. 16 A top view and cross-sectional views illustrating a semiconductor device of one embodiment of the present invention.
Figure 16C:
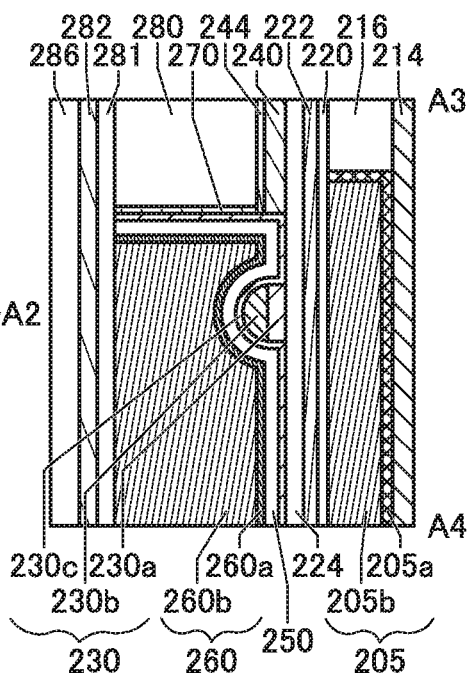
Figure 16B:
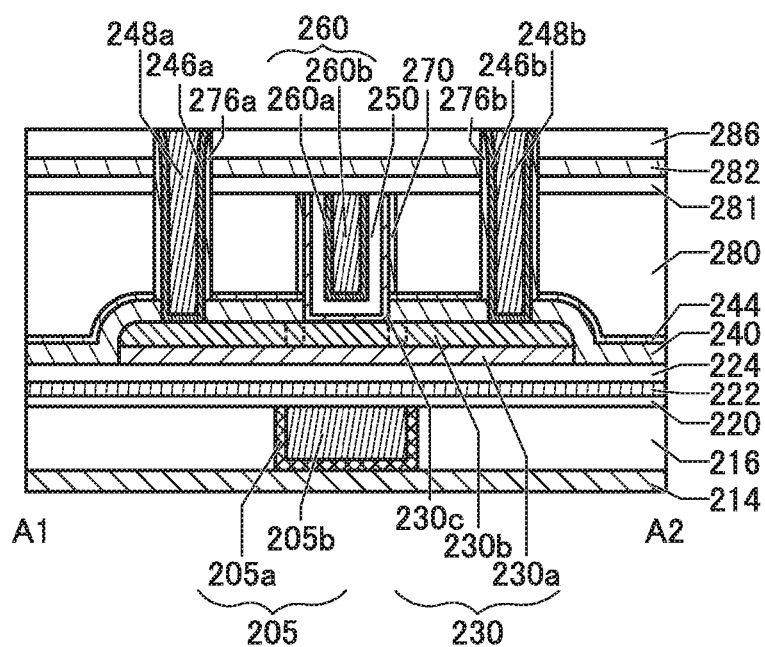

FIG. 16(A) is a top view of a transistor 200c, FIG. 16(B) is a cross-sectional view taken along the dashed-dotted line A1-A2 in FIG. 16(A), and FIG. 16(C) is a cross-sectional view taken along the dashed-dotted line A3-A4 in FIG. 16(A).

The transistor 200c illustrated in FIG. 16 is different from the transistor 200 illustrated in FIG. 1 in including an oxide 230c formed in contact with side surfaces of the barrier film 270, the barrier film 244, and the insulator 240 and a top surface of the oxide 230b.

For example, in the case where an oxide containing excess oxygen is used as the oxide 230c, oxygen can be supplied mainly to a region of the oxide 230b in contact with the oxide 230c in the deposition of the oxide film to be the oxide 230c or by heat treatment after the deposition of the oxide film to be the oxide 230c. In the deposition of the oxide film to be the oxide 230c, part of oxygen contained in a sputtering gas is supplied to the oxide 230b in some cases. The oxygen is supplied mainly to the region, whereby the oxygen vacancies in the region can be filled. The region where oxygen vacancies are filled has a lowered carrier density and a heightened resistance. Such a structure facilitates the formation of the source region or the drain region and the channel formation region that are separated from each other.

The region is formed in a region overlapping with the insulator 250 with the oxide 230c positioned therebetween, for example. When an insulator from which oxygen is released by heating is used as the insulator 250, oxygen released from the insulator 250 upon heat treatment or the like is transmitted through the oxide 230c and added to the region of the oxide 230b in contact with the oxide 230c. Therefore, oxygen vacancies in the region 234 are filled, the carrier density is reduced, and the resistance is increased. Such a structure facilitates the formation of the source region or the drain region and the channel formation region that are separated from each other.

The oxide 230b and the oxide 230c preferably contain a common constituent element (element serving as a main component) besides oxygen. The density of defect states at an interface between the oxide 230b and the oxide 230c can be made low when the oxide 230b and the oxide 230c contain a common constituent element besides oxygen, whereby the influence of interface scattering on carrier conduction is small and a high on-state current can be obtained.

The oxide 230c is over the oxide 230b, whereby impurities can be inhibited from being diffused into the oxide 230b from the structure bodies formed above the oxide 230c.

Next, a method for manufacturing the transistor 200c illustrated in FIG. 16 will be described. The manufacturing method of the transistor 200b is the same as the manufacturing method of the transistor 200 up to the step of forming the insulator 240 illustrated in FIG. 10.

Then, the oxide film to be the oxide 230c, the insulating film 250A to be the insulator 250, the conductive film to be the conductor 260a, and the conductive film to be the conductor 260b are formed in this order.

Next, unnecessary portions of the conductive film to be the conductor 260b, the conductive film to be the conductor 260a, the insulating film 250A, and the oxide film to be the oxide 230c are removed. For example, part of the conductive film to be the conductor 260b, part of the conductive film to be the conductor 260a, part of the insulating film 250A, part of the oxide film to be the oxide 230c, and the hard mask 290b are removed by etch-back treatment, CMP treatment, or the like until the insulator 280 is exposed, whereby the conductor 260 (the conductor 260a and the conductor 260b), the insulator 250, and the oxide 230c are formed.

Through the above process, the transistor 200c can be manufactured.

Note that this embodiment can be implemented in appropriate combination with the other embodiments.

Embodiment 2

In this embodiment, one embodiment of a semiconductor device will be described with reference to FIG. 17 and FIG. 18.

<Memory Device>

Figure 17:
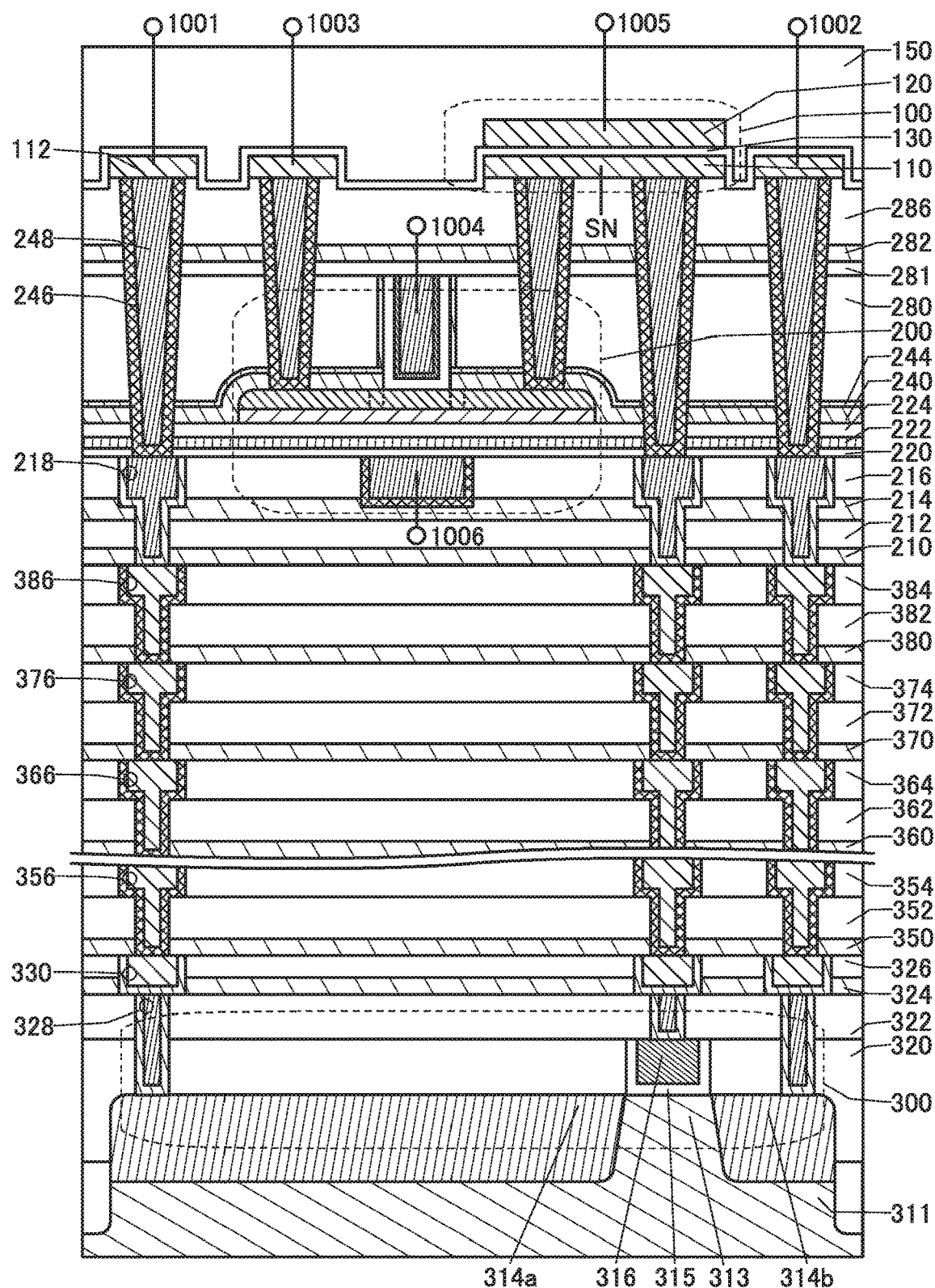
FIG. 17 A cross-sectional view illustrating a structure of a memory device of one embodiment of the present invention.
Figure 18:
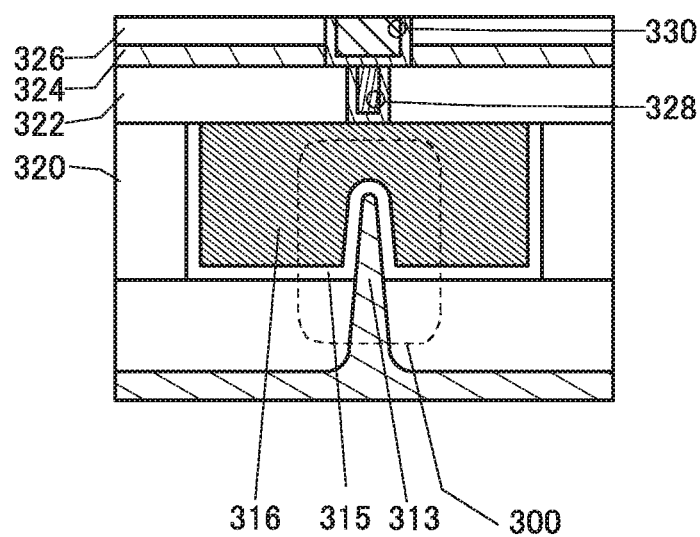
FIG. 18 A cross-sectional view illustrating a structure of a memory device of one embodiment of the present invention.

A memory device illustrated in FIG. 17 and FIG. 18 includes a transistor 300, the transistor 200, and a capacitor 100. FIG. 17 is a cross-sectional view of the transistor 200 and the transistor 300 in the channel length direction. FIG. 18 illustrates a cross-sectional view of the transistor 300 in the vicinity of the transistor 300 in the channel width direction. Note that in the memory device illustrated in FIG. 17, components having the same functions as the components included in the semiconductor device described in the above embodiment are denoted by the same reference numerals.

The transistor 200 is a transistor in which a channel is formed in a semiconductor layer including an oxide semiconductor. Since the off-state current of the transistor 200 is low, a memory device including the transistor 200 can retain stored data for a long time. In other words, such a memory device does not require refresh operation or has an extremely low frequency of the refresh operation, which leads to a sufficient reduction in power consumption of the memory device.

In the memory device illustrated in FIG. 17, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The memory device illustrated in FIG. 17 has a feature allowing retention of the gate potential of the transistor 300 and thus enables data writing, retention, and reading as described below.

Writing and retaining of data are described. First, the potential of the wiring 1004 is set to a potential at which the transistor 200 is brought into a conduction state, so that the transistor 200 is brought into a conduction state. Accordingly, the potential of the wiring 1003 is supplied to a node SN to which the gate of the transistor 300 and one electrode of the capacitor 100 are electrically connected. That is, a predetermined charge is supplied to the gate of the transistor 300 (writing). Here, one of two kinds of charges providing different potential levels (hereinafter referred to as a Low-level charge and a High-level charge) is supplied. After that, the potential of the wiring 1004 is set to a potential at which the transistor 200 is brought into a non-conduction state, so that the transistor 200 is brought into a non-conduction state. Thus, the charge is retained in the node SN (retaining).

In the case where the off-state current of the transistor 200 is low, the charge in the node SN is retained for a long time.

Next, reading of data is described. An appropriate potential (reading potential) is supplied to the wiring 1005 while a predetermined potential (constant potential) is supplied to the wiring 1001, whereby the wiring 1002 has a potential corresponding to the amount of charge retained in the node SN. This is because when the transistor 300 is of an n-channel type, an apparent threshold voltage $V_{th\_H}$ at the time when the High-level charge is supplied to the gate of the transistor 300 is lower than an apparent threshold voltage $V_{th\_L}$ at the time when the Low-level charge is supplied to the gate of the transistor 300. Here, an apparent threshold voltage refers to the potential of the wiring 1005 which is needed to bring the transistor 300 into a "conduction state". Thus, the potential of the wiring 1005 is set to a potential $V_0$ which is between $V_{th\_H}$ and $V_{th\_L}$, whereby the charge supplied to the node SN can be determined. For example, in the case where the High-level charge is supplied to the node SN in writing and the potential of the wiring 1005 is $V_0$ ($>V_{th\_H}$), the transistor 300 is brought into a "conduction state". Meanwhile, in the case where the Low-level charge is supplied to the node SN, the transistor 300 remains in a "non-conduction state" even when the potential of the wiring 1005 is $V_0$ ($<V_{th\_L}$). Thus, the data retained in the node SN can be read by determining the potential of the wiring 1002.

<Structure of Memory Device>

The memory device of one embodiment of the present invention includes the transistor 300, the transistor 200, and the capacitor 100, as illustrated in FIG. 17. The transistor 200 is provided above the transistor 300, and the capacitor 100 is provided above the transistor 300 and the transistor 200.

The transistor 300 is provided on a substrate 311 and includes a conductor 316, an insulator 315, a semiconductor region 313 that is part of the substrate 311, and a low-resistance region 314a and a low-resistance region 314b functioning as a source region and a drain region.

As illustrated in FIG. 18, in the transistor 300, a top surface and a side surface in the channel width direction of the semiconductor region 313 are covered with the conductor 316 with the insulator 315 therebetween. When the transistor 300 is such a Fin-type transistor, the effective channel width is increased, whereby the on-state characteristics of the transistor 300 can be improved. In addition, since contribution of an electric field of a gate electrode can be increased, the off-state characteristics of the transistor 300 can be improved.

The transistor 300 is either a p-channel transistor or an n-channel transistor.

It is preferable that a region of the semiconductor region 313 where a channel is formed, a region in the vicinity thereof, the low-resistance region 314a and the low-resistance region 314b functioning as the source region or the drain region, and the like contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is adjusted by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum for the conductor, and it is particularly preferable to use tungsten in terms of heat resistance.

Note that the transistor 300 illustrated in FIG. 17 is only an example and the structure is not limited thereto; a transistor appropriate for a circuit configuration or a driving method can be used.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300 or the like underlying the insulator 322. For example, a top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 200 is provided.

For the film having a barrier property against hydrogen, silicon nitride formed by a CVD method can be used, for example. The diffusion of hydrogen into a semiconductor element including an oxide semiconductor, such as the transistor 200, degrades the electric characteristics of the semiconductor element in some cases. Therefore, a film that prevents hydrogen diffusion is preferably provided between the transistor 200 and the transistor 300. The film that prevents hydrogen diffusion is specifically a film from which only a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 or less times the relative permittivity of the insulator 324, further preferably 0.6 or less times the relative permittivity of the insulator 324. When a material with a low permittivity is used for an interlayer film, parasitic capacitance generated between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 have a function as plugs or wirings. A plurality of conductors having a function as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material of each of the plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 17, an insulator 350, an insulator 352, and an insulator 354 are stacked sequentially. Furthermore, a conductor 356 is formed in the insulator 350, the insulator 352, and the insulator 354. The conductor 356 has a function as a plug or a wiring. Note that the conductor 356 can be provided using a material similar to those of the conductor 328 and the conductor 330.

Like the insulator 324, the insulator 350 is preferably formed using an insulator having a barrier property against hydrogen, for example. Furthermore, the conductor 356 preferably contains a conductor having a barrier property against hydrogen. In particular, the conductor having a barrier property against hydrogen is preferably formed in an opening portion of the insulator 350 having a barrier property against hydrogen. In such a structure, the transistor 300 and the transistor 200 can be separated by a layer having a barrier property against hydrogen (such a layer is also referred to as a barrier layer), so that the diffusion of hydrogen from the transistor 300 to the transistor 200 can be inhibited.

Note that as the conductor having a barrier property against hydrogen, tantalum nitride may be used, for example. The use of a stack including tantalum nitride and tungsten having high conductivity can inhibit the diffusion of hydrogen from the transistor 300 to the transistor 200 while the conductivity of a wiring is kept. In that case, a structure is preferable in which the tantalum nitride layer having a barrier property against hydrogen is in contact with the insulator 350 having a barrier property against hydrogen.

A wiring layer may be provided over the insulator 354 and the conductor 356. For example, in FIG. 17, an insulator 360, an insulator 362, and an insulator 364 are stacked sequentially. Furthermore, a conductor 366 is formed in the insulator 360, the insulator 362, and the insulator 364. The conductor 366 has a function as a plug or a wiring. Note that the conductor 366 can be provided using a material similar to those of the conductor 328 and the conductor 330.

Like the insulator 324, the insulator 360 is preferably formed using an insulator having a barrier property against hydrogen, for example. Furthermore, the conductor 366 preferably contains a conductor having a barrier property against hydrogen. In particular, the conductor having a barrier property against hydrogen is formed in an opening portion of the insulator 360 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 364 and the conductor 366. For example, in FIG. 17, an insulator 370, an insulator 372, and an insulator 374 are stacked sequentially. Furthermore, a conductor 376 is formed in the insulator 370, the insulator 372, and the insulator 374. The conductor 376 has a function as a plug or a wiring. Note that the conductor 376 can be formed using a material similar to those of the conductor 328 and the conductor 330.

Like the insulator 324, the insulator 370 is preferably formed using an insulator having a barrier property against hydrogen, for example. Furthermore, the conductor 376 preferably contains a conductor having a barrier property against hydrogen. In particular, the conductor having a barrier property against hydrogen is formed in an opening portion of the insulator 370 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 374 and the conductor 376. For example, in FIG. 17, an insulator 380, an insulator 382, and an insulator 384 are stacked sequentially. Furthermore, a conductor 386 is formed in the insulator 380, the insulator 382, and the insulator 384. The conductor 386 has a function as a plug or a wiring. Note that the conductor 386 can be formed using a material similar to those of the conductor 328 and the conductor 330.

Like the insulator 324, the insulator 380 is preferably formed using an insulator having a barrier property against hydrogen, for example. Furthermore, the conductor 386 preferably contains a conductor having a barrier property against hydrogen. In particular, the conductor having a barrier property against hydrogen is formed in an opening portion of the insulator 380 having a barrier property against hydrogen. In such a structure, the transistor 300 and the transistor 200 can be separated by a barrier layer, so that the diffusion of hydrogen from the transistor 300 to the transistor 200 can be prevented.

Although the wiring layer including the conductor 356, the wiring layer including the conductor 366, the wiring layer including the conductor 376, and the wiring layer including the conductor 386 are described above, the memory device of this embodiment is not limited thereto. Three or less wiring layers which are similar to the wiring layer including the conductor 356 may be provided, or five or more wiring layers which are similar to the wiring layer including the conductor 356 may be provided.

An insulator 210, an insulator 212, the insulator 214, and the insulator 216 are stacked sequentially over the insulator 384 and the conductor 386. A substance having a barrier property against oxygen or hydrogen is preferably used for any of the insulator 210, the insulator 212, the insulator 214, and the insulator 216.

For example, the insulator 210 and the insulator 214 are preferably formed using a film having a barrier property that prevents hydrogen or impurities from diffusing from the substrate 311, a region where the transistor 300 is provided, or the like to a region where the transistor 200 is provided. Therefore, a material similar to that of the insulator 324 can be used.

For the film having a barrier property against hydrogen, silicon nitride formed by a CVD method can be used, for example. The diffusion of hydrogen into a semiconductor element including an oxide semiconductor, such as the transistor 200, degrades the electric characteristics of the semiconductor element in some cases. Therefore, a film that prevents hydrogen diffusion is preferably provided between the transistor 200 and the transistor 300. The film that prevents hydrogen diffusion is specifically a film from which only a small amount of hydrogen is released.

For the film having a barrier property against hydrogen used as the insulator 210 and the insulator 214, for example, a metal oxide such as aluminum oxide, hafnium oxide, or tantalum oxide is preferably used.

In particular, aluminum oxide has an excellent blocking effect that inhibits the passage of both oxygen and impurities such as hydrogen and moisture which are factors in change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide included in the transistor 200 can be prevented. Therefore, aluminum oxide is suitably used as a protective film of the transistor 200.

The insulator 212 and the insulator 216 can be formed using a material similar to that of the insulator 320, for example. In the case where a material with a relatively low permittivity is used for an interlayer film, parasitic capacitance generated between wirings can be reduced. A silicon oxide film, a silicon oxynitride film, or the like can be used as the insulator 212 and the insulator 216, for example.

A conductor 218, the conductor (the conductor 205) included in the transistor 200, and the like are embedded in the insulator 210, the insulator 212, the insulator 214, and the insulator 216. Note that the conductor 218 has a function as a plug or a wiring that is electrically connected to the capacitor 100 or the transistor 300. The conductor 218 can be provided using a material similar to those of the conductor 328 and the conductor 330.

In particular, the conductor 218 in a region in contact with the insulator 210 and the insulator 214 is preferably a conductor having a barrier property against oxygen, hydrogen, and water. In such a structure, the transistor 300 and the transistor 200 can be separated by a layer having a barrier property against oxygen, hydrogen, and water; thus, the diffusion of hydrogen from the transistor 300 to the transistor 200 can be prevented.

The transistor 200 is provided over the insulator 216. Note that the structure of the transistor included in the semiconductor device described in the above embodiment can be used as the structure of the transistor 200. Note that the transistor 200 illustrated in FIG. 17 is only an example and the structure is not limited thereto; a transistor appropriate for a circuit configuration or a driving method is used.

The insulator 280 is provided over the transistor 200.

The insulator 281 is provided over the insulator 280. An insulator that releases oxygen by heat treatment is preferably used as the insulator 281. For example, a silicon oxide film, a silicon oxynitride film, or the like is preferably used as the insulator 281.

The insulator 282 is provided over the insulator 281. A substance having a barrier property against oxygen or hydrogen is preferably used for the insulator 282. Thus, the insulator 282 can be formed using a material similar to that of the insulator 214. For the insulator 282, a metal oxide such as aluminum oxide, hafnium oxide, or tantalum oxide is preferably used, for example.

In particular, aluminum oxide has an excellent blocking effect that inhibits the passage of both oxygen and impurities such as hydrogen and moisture which are factors in change in electrical characteristics of the transistor. Accordingly, the use of aluminum oxide can prevent the entry of impurities such as hydrogen and moisture into the transistor 200 in and after a manufacturing process of the transistor. In addition, release of oxygen from the oxide included in the transistor 200 can be prevented. Therefore, aluminum oxide is suitably used as a protective film of the transistor 200.

The insulator 286 is provided over the insulator 282. The insulator 286 can be formed using a material similar to that of the insulator 320. In the case where a material with a relatively low permittivity is used for an interlayer film, parasitic capacitance generated between wirings can be reduced. For example, a silicon oxide film, a silicon oxynitride film, or the like can be used as the insulator 286.

The conductor 246, the conductor 248, and the like are embedded in the insulator 240, the insulator 244, the insulator 280, the insulator 281, the insulator 282, the insulator 286, and the like.

The conductor 246 and the conductor 248 have a function as plugs or wirings that are electrically connected to the capacitor 100, the transistor 200, or the transistor 300. The conductor 246 and the conductor 248 can be provided using a material similar to those of the conductor 328 and the conductor 330.

In addition, the capacitor 100 is provided above the transistor 200. The capacitor 100 includes a conductor 110, the conductor 120, and an insulator 130.

A conductor 112 may be provided over the conductor 246 and the conductor 248. The conductor 112 has a function as a plug or a wiring that is electrically connected to the capacitor 100, the transistor 200, or the transistor 300. The conductor 110 has a function as the electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 17; however, the structure is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductor 112 and the conductor 110. The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

A material with high dielectric strength, such as silicon oxynitride, is preferably used for the insulator 130, for example. In the capacitor 100 having such a structure, the dielectric strength can be increased and the electrostatic breakdown of the capacitor 100 can be prevented because of the presence of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material can be used.

An insulator 150 is provided over the conductor 120 and the insulator 130. The insulator 150 can be provided using a material similar to that of the insulator 320. The insulator 150 may function as a planarization film that covers an uneven shape thereunder.

With the use of the structure, a change in electrical characteristics can be prevented and reliability can be improved in a semiconductor device using a transistor including an oxide semiconductor. Alternatively, a transistor including an oxide semiconductor having a high on-state current can be provided. Alternatively, a transistor including an oxide semiconductor having a low off-state current can be provided. Alternatively, a semiconductor device with reduced power consumption can be provided.

The composition, structure, method, and the like described above in this embodiment can be used in combination as appropriate with the compositions, structures, methods, and the like described in the other embodiments.

Embodiment 3

In this embodiment, a NOSRAM is described as an example of a memory device of one embodiment of the present invention, which includes a capacitor and a transistor using a metal oxide in its channel formation region (hereinafter referred to as an OS transistor) with reference to FIG. 19 and FIG. 20. A NOSRAM (registered trademark) is an abbreviation of "Nonvolatile Oxide Semiconductor Random Access Memory", which indicates a RAM including a gain cell (2T or 3T) memory cell. Note that hereinafter, a memory device using an OS transistor, such as the NOSRAM, is referred to as an OS memory in some cases.

A memory device in which OS transistors are used in memory cells is used in the NOSRAM. The OS memory is a memory including at least a capacitor and an OS transistor that controls charging and discharging of the capacitor. Since the OS transistor is a transistor with an extremely low off-state current, the OS memory has excellent retention characteristics and thus can function as a nonvolatile memory.

<<NOSRAM>>

Figure 19:
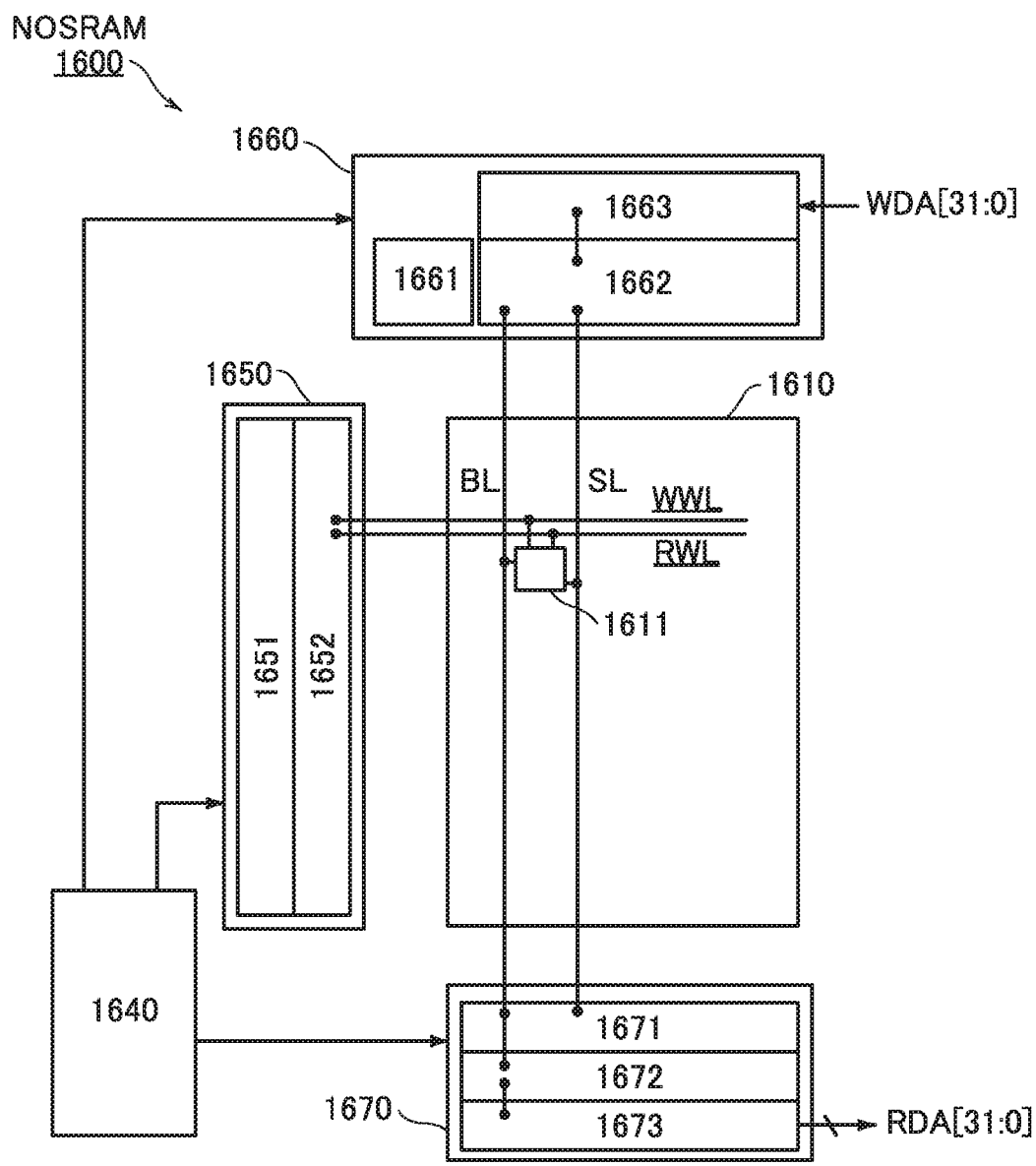
FIG. 19 A block diagram illustrating a configuration example of a memory device of one embodiment of the present invention.

FIG. 19 shows a configuration example of a NOSRAM. A NOSRAM 1600 shown in FIG. 19 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL, a plurality of word lines RWL, a plurality of bit lines BL, and a plurality of source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole and writes data WDA[31:0] and reads out data RDA[31:0]. The controller 1640 processes command signals from the outside (e.g., a chip enable signal and a write enable signal) to generate control signals for the row driver 1650, the column driver 1660, and the output driver 1670.

The row driver 1650 has a function of selecting a row to be accessed. The row driver 1650 includes a row decoder 1651 and a word line driver 1652.

The column driver 1660 drives a source line SL and a bit line BL. The column driver 1660 includes a column decoder 1661, a write driver 1662, and a DAC (digital-analog converter circuit) 1663.

The DAC 1663 converts 3-bit digital data into an analog voltage. The DAC 1663 converts 32-bit data WDA[31:0] into an analog voltage per 3 bits.

The write driver 1662 has a function of precharging the source line SL, a function of bringing the source line SL into an electrically floating state, a function of selecting the source line SL, a function of inputting a writing voltage generated by the DAC 1663 to the selected source line SL, a function of precharging the bit line BL, a function of bringing the bit line BL into an electrically floating state, and the like.

The output driver 1670 includes a selector 1671, an ADC (analog-digital converter circuit) 1672, and an output buffer 1673. The selector 1671 selects a source line SL to be accessed and transmits voltage of the selected source line SL to the ADC 1672. The ADC 1672 has a function of converting an analog voltage into 3-bit digital data. The voltage of the source line SL is converted into 3-bit digital data in the ADC 1672, and the output buffer 1673 stores the data output from the ADC 1672.

<Memory Cell>

Figure 20A:
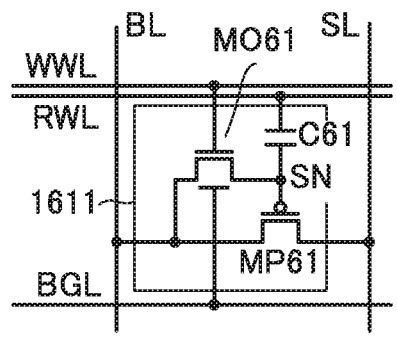
FIG. 20 Circuit diagrams each illustrating a configuration example of a memory device of one embodiment of the present invention.

FIG. 20(A) is a circuit diagram showing a configuration example of the memory cell 1611. The memory cell 1611 is a 2T gain cell and is electrically connected to the word line WWL, the word line RWL, the bit line BL, the source line SL, and the wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for retaining the potential of the node SN. The node SN is a data retaining node and corresponds to a gate of the transistor MP61 here.

The write transistor of the memory cell 1611 is formed using the OS transistor MO61; thus, the NOSRAM 1600 can retain data for a long time.

Figure 20B:
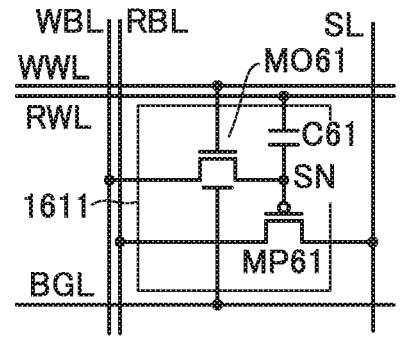

In the example of FIG. 20(A), the bit line is a common bit line for writing and reading; however, as shown in FIG. 20(B), a write bit line WBL and a read bit line RBL may be provided.

Figure 20C:
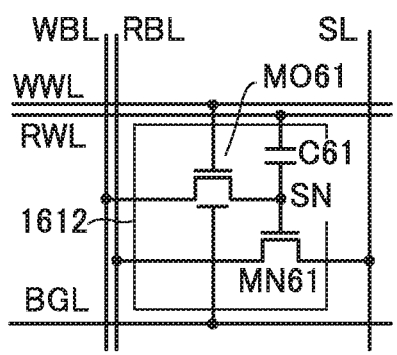
Figure 20D:
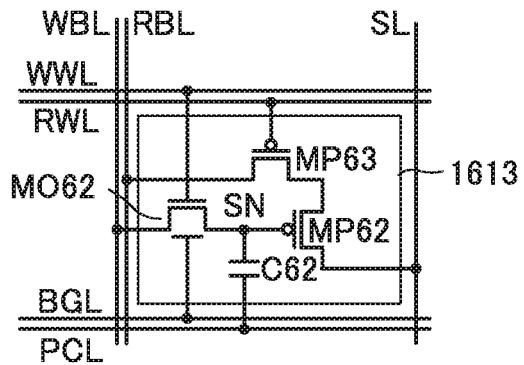
Figure 20E:
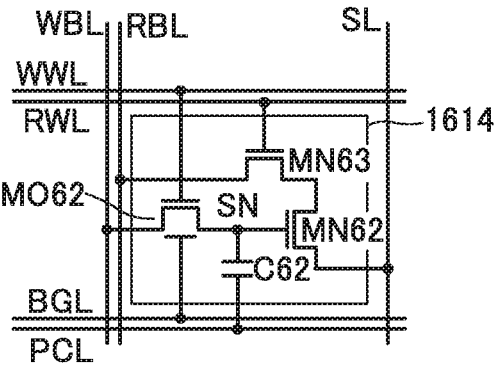

FIG. 20(C) to FIG. 20(E) show other configuration examples of the memory cell. FIG. 20(C) to FIG. 20(E) show examples where the write bit line and the read bit line are provided; however, as shown in FIG. 20(A), a bit line BL used both in writing and reading may be provided.

A memory cell 1612 shown in FIG. 20(C) is a modification example of the memory cell 1611 where the read transistor is changed into an n-channel transistor (MN61). The transistor MN61 may be an OS transistor or a Si transistor.

The OS transistors MO61 in the memory cell 1611 and the memory cell 1612 may each be an OS transistor with no back gate.

A memory cell 1613 shown in FIG. 20(D) is a 3T gain cell and is electrically connected to the word line WWL, the word line RWL the bit line WBL, the bit line RBL, the source line SL, the wiring BGL, and a wiring PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

A memory cell 1614 shown in FIG. 20(E) is a modification example of the memory cell 1613 where the read transistor and the selection transistor are changed into n-channel transistors (MN62 and MN63). The transistor MN62 and the transistor MN63 may each be an OS transistor or a Si transistor.

The OS transistors provided in the memory cell 1611 to the memory cell 1614 may each be a transistor with no back gate or a transistor with a back gate.

There is theoretically no limitation on the number of rewriting operations of the NOSRAM 1600 because data is rewritten by charging and discharging of the capacitor C61; and data can be written and read with low energy. Furthermore, since data can be retained for a long time, the refresh rate can be reduced.

In the case where the semiconductor device described in the above embodiment is used for the memory cell 1611, the memory cell 1612, the memory cell 1613, and the memory cell 1614, the transistor 200 can be used as the OS transistor MO61 and the transistor MO62, the capacitor 100 can be used as the capacitor C61 and the capacitor C62, and the transistor 300 can be used as the transistor MP61 and the transistor MN62. Thus, the area occupied by each set consisting of one transistor and one capacitor in the top view can be reduced, so that the memory device of this embodiment can achieve higher integration. As a result, storage capacity per unit area of the memory device of this embodiment can be increased.

The structure described in this embodiment can be used in combination with the structures described in the other embodiments as appropriate.

Embodiment 4

In this embodiment, a DOSRAM will be described as an example of the memory device of one embodiment of the present invention that includes an OS transistor and a capacitor, with reference to FIG. 21 and FIG. 22. A DOSRAM (registered trademark) is an abbreviation of "Dynamic Oxide Semiconductor Random Access Memory," which is a RAM including a 1T (transistor) 1C (capacitor) memory cell. As in the NOSRAM, an OS memory is used in the DOSRAM.

<<DOSRAM 1400>>

Figure 21:
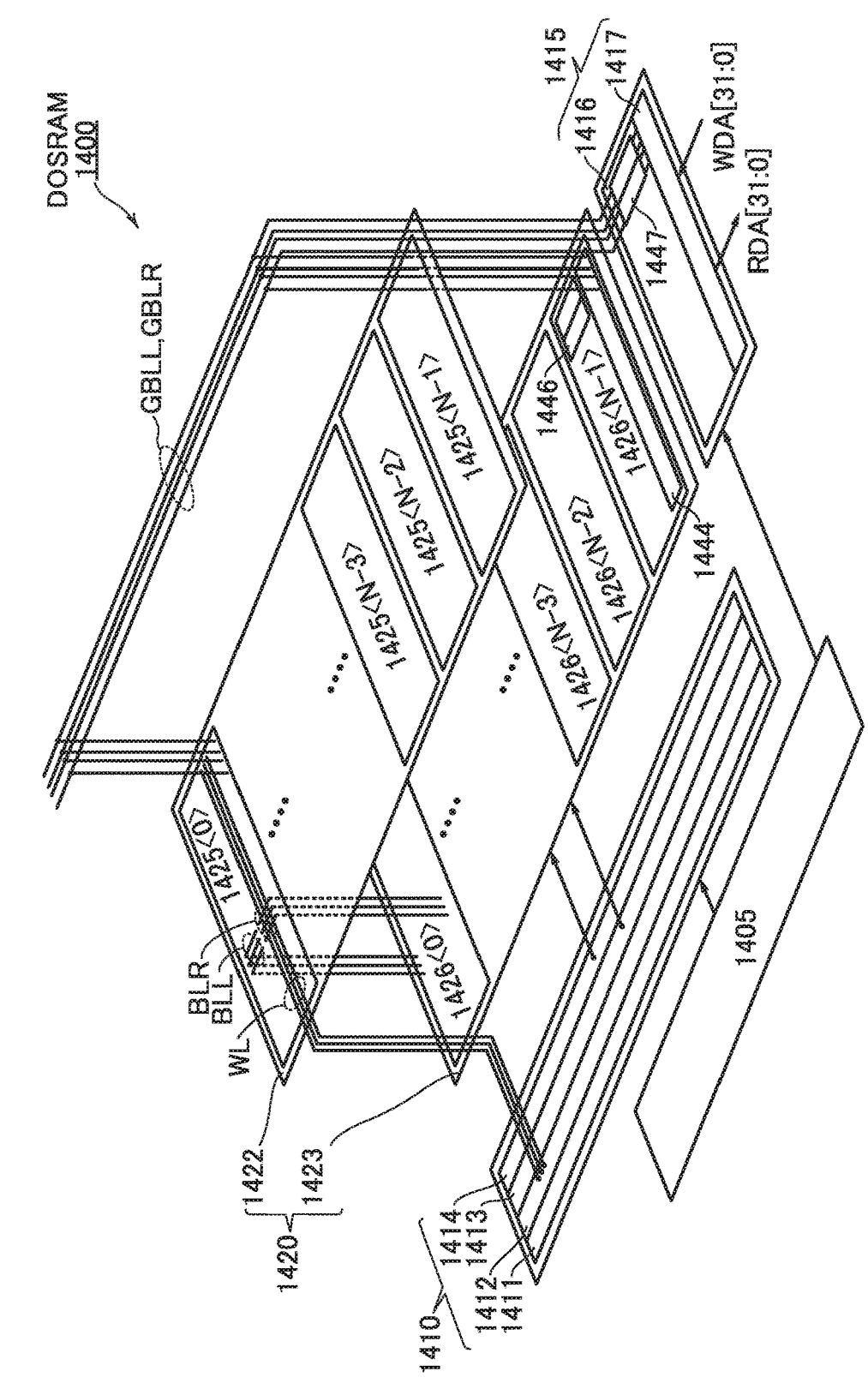
FIG. 21 A block diagram illustrating a configuration example of a memory device of one embodiment of the present invention.

FIG. 21 shows a configuration example of the DOSRAM. As shown in FIG. 21, a DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and a global bit line GBLL and a global bit line GBLR.

(MC-SA Array 1420)

The MC-SA array 1420 has a stacked-layer structure where the memory cell array 1422 is stacked over the sense amplifier array 1423. The global bit line GBLL and the global bit line GBLR are stacked over the memory cell array 1422. The DOSRAM 1400 adopts, as the bit-line structure, a hierarchical bit line structure hierarchized with local bit lines and global bit lines.

Figure 22A:
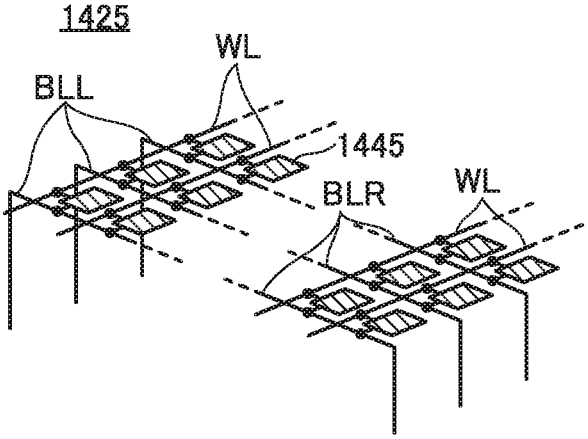
FIG. 22 A block diagram and a circuit diagram illustrating a configuration example of a memory device of one embodiment of the present invention.

The memory cell array 1422 includes N local memory cell arrays 1425<0> to 1425<N−1> (N is an integer greater than or equal to 2). FIG. 22(A) illustrates a configuration example of the local memory cell array 1425. The local memory cell array 1425 includes a plurality of memory cells 1445, a plurality of word lines WL, a plurality of bit lines BLL, and a plurality of bit lines BLR. In the example of FIG. 22(A), the local memory cell array 1425 has an open bit-line architecture but may have a folded bit-line architecture.

Figure 22B:
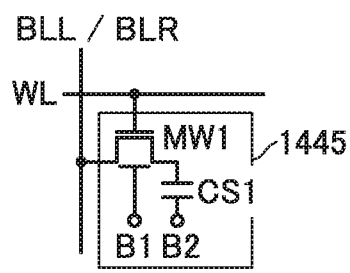

FIG. 22(B) shows a circuit configuration example of the memory cell 1445. The memory cell 1445 includes a transistor MW1, a capacitor CS1, a terminal B1, and a terminal B2. The transistor MW1 has a function of controlling charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor. A second terminal of the capacitor CS1 is electrically connected to the terminal B2. A constant potential (e.g., a low power supply potential) is input to the terminal B2.

In the case where the semiconductor device described in the above embodiment is used in the memory cell 1445, the transistor 200 can be used as the transistor MW1, and the capacitor 100 can be used as the capacitor CS1. Thus, the area occupied by each set consisting of one transistor and one capacitor in the top view can be reduced, so that the memory device of this embodiment can achieve higher integration. As a result, storage capacity per unit area of the memory device of this embodiment can be increased.

The transistor MW1 includes a back gate, and the back gate is electrically connected to the terminal B1. This makes it possible to change $V_{th}$ of the transistor MW1 with a voltage of the terminal B1. For example, the voltage of the terminal B1 is a fixed voltage (e.g., a negative constant voltage); alternatively, the voltage of the terminal B1 may be changed in response to the operation of the DOSRAM 1400.

The back gate of the transistor MW1 may be electrically connected to the gate, the source, or the drain of the transistor MW1. Alternatively, the back gate is not necessarily provided in the transistor MW1.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a potential difference between the bit line pair, and a function of retaining the potential difference. The switch array 1444 has a function of selecting a bit line pair and bringing electrical continuity between the selected bit line pair and a global bit line pair.

Here, a bit line pair refers to two bit lines which are compared by a sense amplifier at the same time. A global bit line pair refers to two global bit lines which are compared by a global sense amplifier at the same time. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signals from the sense amplifier driver circuit 1414, the plurality of local sense amplifier arrays 1426 are independently driven.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a potential difference between the global bit line pair (GBLL, GBLR) and a function of retaining the potential difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a target column. The local sense amplifier array 1426 amplifies the written data and retains the amplified data. In the specified local memory cell array 1425, the word line WL of a target row is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified by an address signal. In the specified local memory cell array 1425, the word line WL of a target row is in a selected state, and data of the memory cell 1445 is written to the bit line. The local sense amplifier array 1426 detects a potential difference between the bit line pair of each column as data, and retains the data. Among the data retained at the local sense amplifier array 1426, the data of a column specified by the address signal is written to the global bit line pair by the switch array 1444. The global sense amplifier array 1416 determines and retains the data of the global bit line pair. The data retained in the global sense amplifier array 1416 is output to the input/output circuit 1417. In this way, the data reading operation is completed.

There is theoretically no limitation on the number of rewriting operations of the DOSRAM 1400 because data is rewritten by charging and discharging of the capacitor CS1; and data can be written and read with low energy. In addition, the memory cell 1445 has a simple circuit configuration, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is much longer than that of a DRAM using a Si transistor. This allows less frequent refresh, which can reduce the power needed for refresh operations. Thus, the DOSRAM 1400 is suitable for a memory device that rewrites a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which can reduce the storage capacitance of the memory cell 1445. In addition, providing the switch array 1444 in the local sense amplifier array 1426 can reduce the number of long bit lines. For the reasons described above, a driving load during access to the DOSRAM 1400 is reduced, which enables a reduction in power consumption.

The structure described in this embodiment can be used in combination with the structures described in the other embodiments as appropriate.

Embodiment 5

In this embodiment, an FPGA (field programmable gate array) is described as an example of a semiconductor device of one embodiment of the present invention in which an OS transistor and a capacitor are used, with reference to FIG. 23 to FIG. 26. In the FPGA of this embodiment, an OS memory is used for a configuration memory and a register. Here, such an FPGA is referred to as an "OS-FPGA".

<<OS-FPGA>>

Figure 23A:
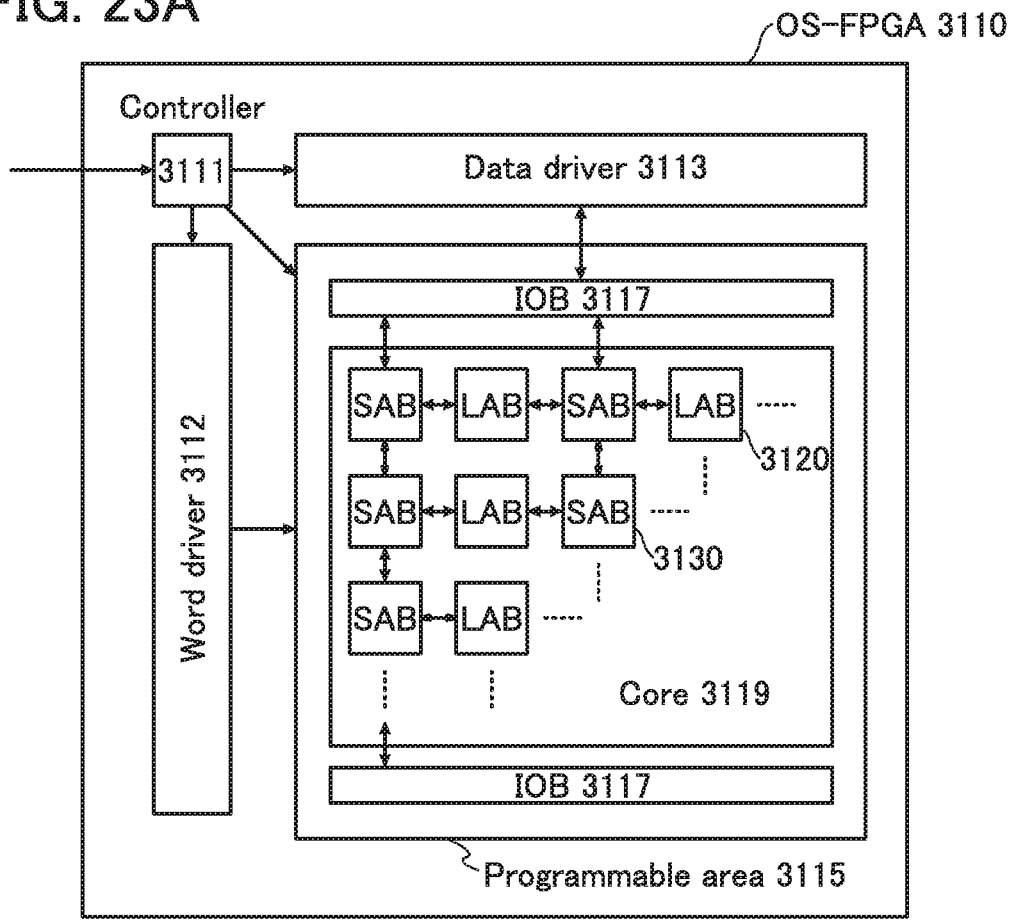
FIG. 23 Block diagrams illustrating a configuration example of a semiconductor device of one embodiment of the present invention.

FIG. 23(A) illustrates a configuration example of an OS-FPGA. An OS-FPGA 3110 illustrated in FIG. 23(A) is capable of context switching by a multi-context configuration, fine-grained power gating, and NOFF (normally-off) computing. The OS-FPGA 3110 includes a controller 3111, a word driver 3112, a data driver 3113, and a programmable area 3115.

Figure 23B:
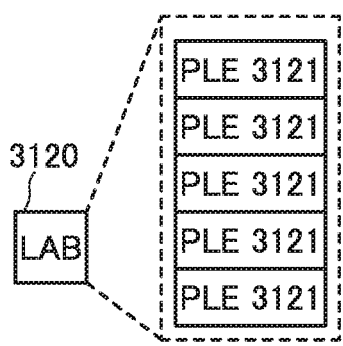
Figure 23C:
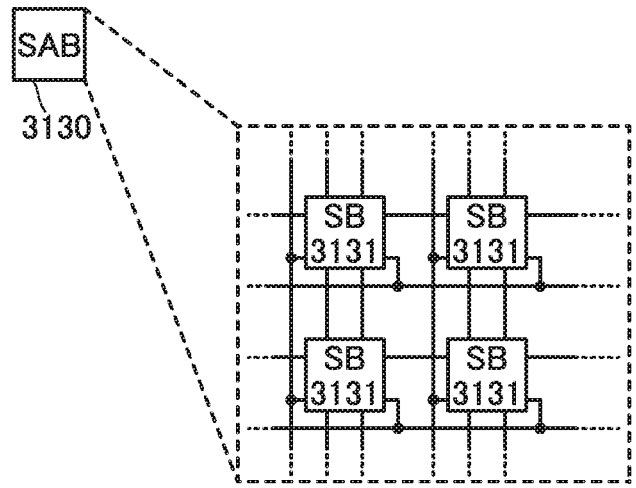

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of programmable logic elements (PLEs) 3121. FIG. 23(B) illustrates an example in which the LAB 3120 includes five PLEs 3121. As illustrated in FIG. 23(C), the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 24A:
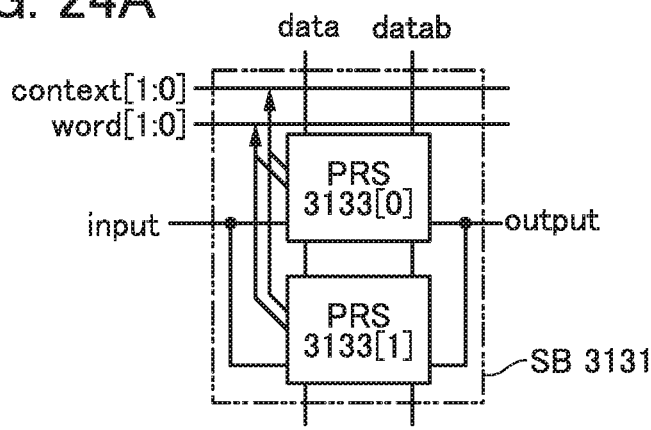
FIG. 24 A block diagram and a circuit diagram illustrating a configuration example of a semiconductor device of one embodiment of the present invention, and a timing chart illustrating an operation example of the semiconductor device.

The SB 3131 is described with reference to FIG. 24(A) to FIG. 24(C). To the SB 3131 illustrated in FIG. 24(A), data, datab, and a signal context[1:0] and a signal word[1:0] are input. The data and the datab are configuration data, and the logics of the data and the datab have a complementary relationship. The number of contexts in the OS-FPGA 3110 is two, and the signal context[1:0] is a context selection signal. The signal word[1:0] is a word line selection signal, and wirings to which the signal word[1:0] is input are each a word line.

The SB 3131 includes a PRS (programmable routing switches) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 24B:
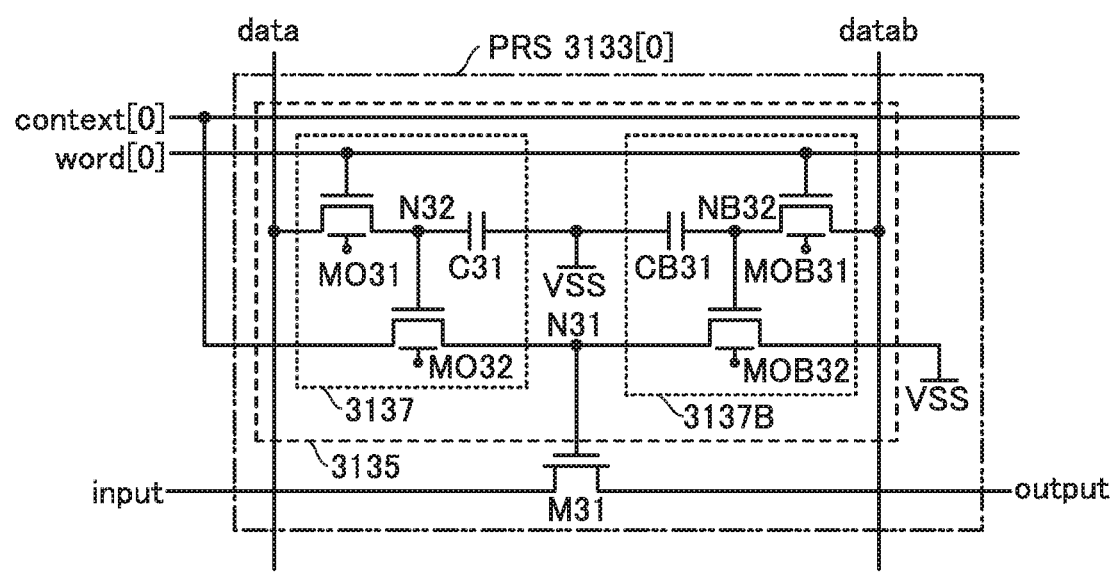
Figure 24C:
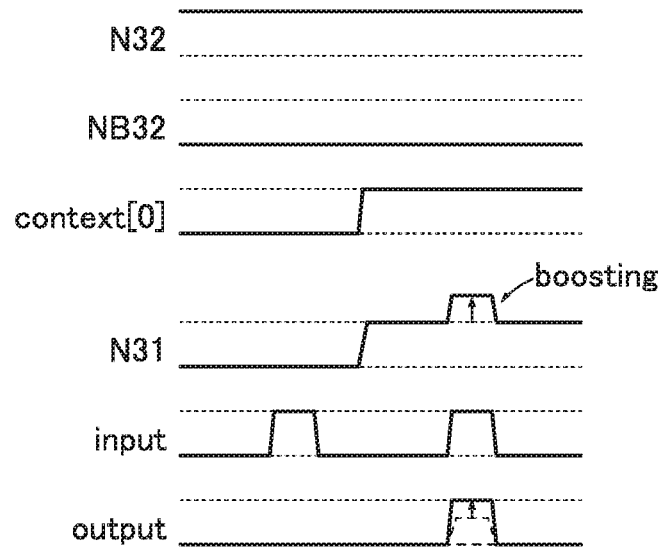

FIG. 24(B) illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

In the case where the semiconductor device described in the above embodiment is used in the SAB 3130, the transistor 200 can be used for the OS transistor MO31, the OS transistor 32, the OS transistor MOB31, and the OS transistor MOB32, and the capacitor 100 can be used for the capacitor C31 and the capacitor CB31. This can reduce the area occupied by each set consisting of one transistor and one capacitor in the top view, so that the semiconductor device of this embodiment can achieve higher integration.

The OS transistor MO31, the OS transistor MO32, the OS transistor MOB31, and the OS transistor MOB32 each include a back gate, and each of these back gates is electrically connected to a power supply line that supplies a fixed potential.

A gate of the Si transistor M31, a gate of the OS transistor MO32, and a gate of the OS transistor MOB32 correspond to a node N31, a node N32, and a node NB32, respectively. The node N32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

Data retained in the memory circuit 3137 and the memory circuit 3137B have a complementary relationship. Thus, either the OS transistor MO32 or the OS transistor MOB32 is turned on.

An operation example of the PRS 3133[0] is described with reference to FIG. 24(C). In the PRS 3133[0], to which configuration data has already been written, the node N32 is at "H", whereas the node NB32 is at "L".

The PRS 3133[0] is inactive while the signal context[0] is at "L". During this period, even when an input terminal (input) of the PRS 3133[0] is transferred to "H", the gate of the Si transistor M31 is kept at "L" and an output terminal (output) of the PRS 3133[0] is also kept at "L".

The PRS 3133[0] is active while the signal context[0] is at "H". When the signal context[0] is transferred to "H", the gate of the Si transistor M31 is transferred to "H" by the configuration data stored in the CM 3135.

When the input terminal is transferred to "H" during a period in which the PRS 3133[0] is active, the gate potential of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also has a function as a multiplexer.

Figure 25:
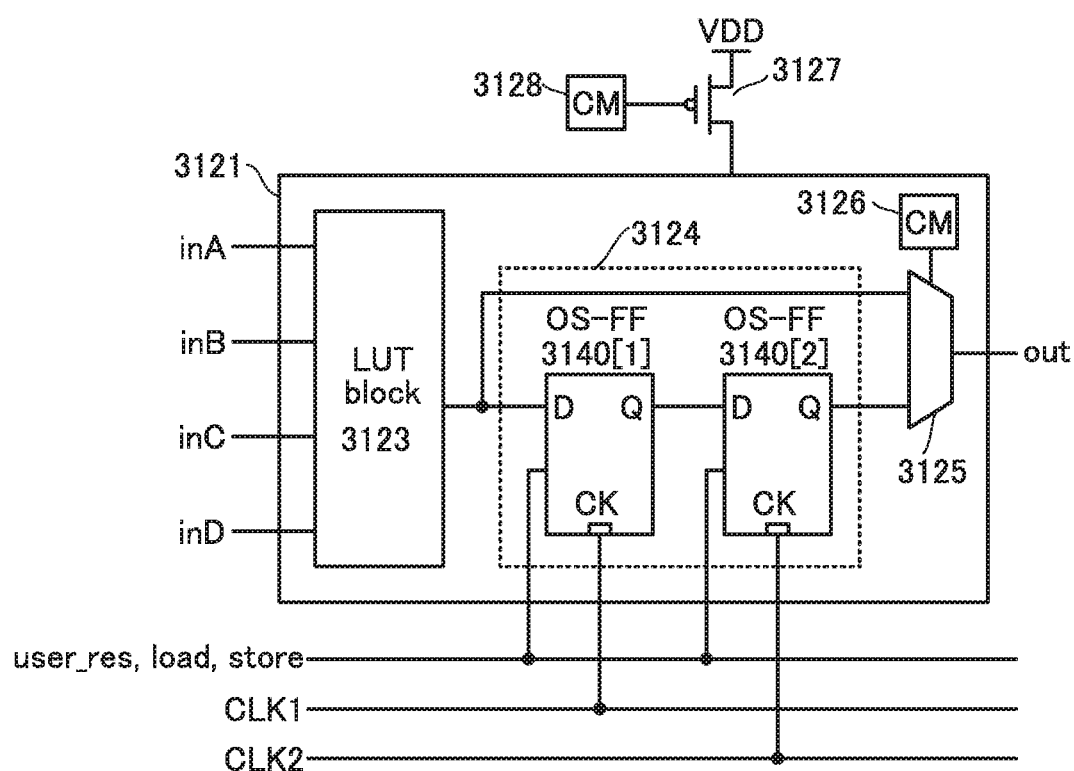
FIG. 25 A block diagram illustrating a configuration example of a semiconductor device of one embodiment of the present invention.

FIG. 25 illustrates a configuration example of the PLE 3121. The PLE 3121 includes an LUT (lookup table) block 3123, a register block 3124, a selector 3125, and a CM 3126. The LUT block 3123 is configured to multiplex an output of a pair of 16-bit CMs therein in accordance with inputs inA to inD. The selector 3125 selects an output of the LUT block 3123 or an output of the register block 3124 in accordance with the configuration stored in the CM 3126, which is regarded as an output out.

The PLE 3121 is electrically connected to a power supply line for a voltage VDD through a power switch 3127. The on/off state of the power switch 3127 is set in accordance with configuration data stored in a CM 3128. Providing the power switch 3127 for each PLE 3121 enables fine-grained power gating. The PLE 3121 that is not used after context switching can be power gated owing to the fine-grained power gating function; thus, standby power can be effectively reduced.

The register block 3124 is formed by nonvolatile registers to achieve NOFF computing. The nonvolatile registers in the PLE 3121 are each a flip-flop provided with an OS memory (hereinafter referred to as [OS-FF]).

The register block 3124 includes an OS-FF 3140[1] and an OS-FF 3140[2]. A signal user_res, a signal load, and a signal store are input to the OS-FF 3140[1] and the OS-FF

Figure 26A:
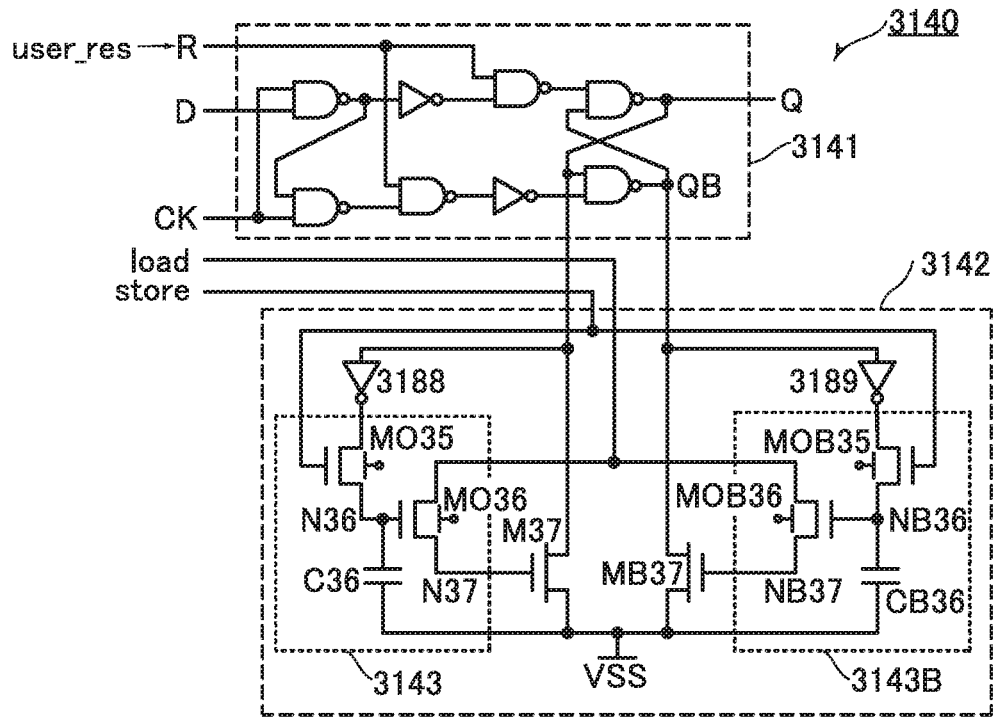
FIG. 26 A circuit diagram illustrating a configuration example of a semiconductor device of one embodiment of the present invention, and a timing chart illustrating an operation example of the semiconductor device.

3140[2]. A clock signal CLK1 is input to the OS-FF 3140[1] and a clock signal CLK2 is input to the OS-FF 3140[2]. FIG. 26(A) illustrates a configuration example of the OS-FF 3140.

The OS-FF 3140 includes an FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB have a complementary relationship.

The shadow register 3142 functions as a backup circuit of the FF 3141. The shadow register 3142 backs up data of the node Q and the node QB in response to the signal store and writes back the backed up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

In the case where the semiconductor device described in the above embodiment is used in the LAB 3120, the transistor 200 can be used as the OS transistor MO35 and the OS transistor MOB35, and the capacitor 100 can be used as the capacitor C36 and the capacitor CB36. Thus, the area occupied by each set consisting of one transistor and one capacitor in the top view can be reduced, so that the semiconductor device of this embodiment can achieve higher integration.

The OS transistor MO35, the OS transistor MO36, the OS transistor MOB35, and the OS transistor MOB36 each include a back gate, and each of these back gates is electrically connected to a power supply line that supplies a fixed potential.

Figure 26B:
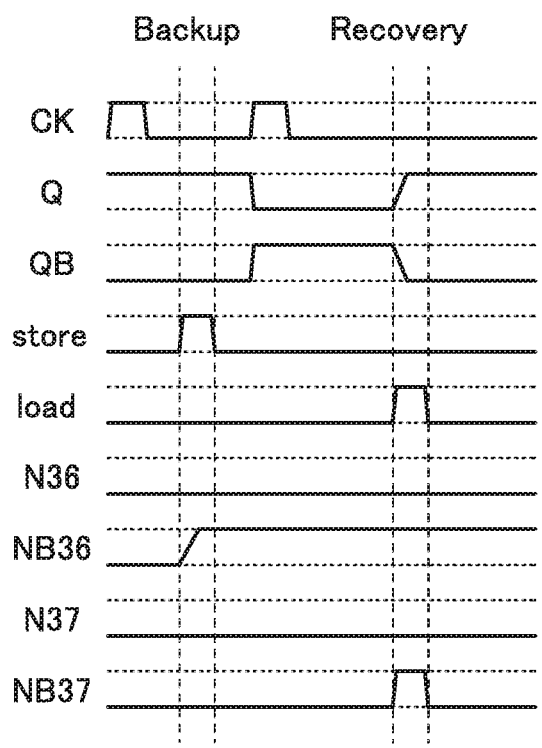

An example of an operation method of the OS-FF 3140 is described with reference to FIG. 26(B).

(Backup)

When the signal store at "H" is input to the OS-FF 3140, the shadow register 3142 backs up data of the FF 3141. The node N36 becomes at "L" when the data of the node Q is written thereto, and the node NB36 becomes at "H" when the data of the node QB is written thereto. After that, power gating is performed and the power switch 3127 is turned off. Although the data of the node Q and the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes at "H" because the node NB36 is at "H". Thus, the node Q becomes "H" and the node QB becomes at "L". That is, the OS-FF 3140 is recovered to a state at the time of the backup operation.

A combination of the fine-grained power gating and backup/recovery operation of the OS-FF 3140 allows power consumption of the OS-FPGA 3110 to be effectively reduced.

As an error that might occur in a memory circuit, a soft error due to the entry of radiation is given. The soft error is a phenomenon in which a malfunction such as inversion of data stored in a memory is caused by electron-hole pair generation when a transistor is irradiated with α rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory using an OS transistor has a high soft-error tolerance. Therefore, the OS-FPGA 3110 with high reliability can be provided when an OS memory is included therein.

The structure described in this embodiment can be used in combination with the structures described in the other embodiments as appropriate.

Embodiment 6

In this embodiment, an AI system in which the semiconductor devices of the above embodiments is used is described with reference to FIG. 27.

Figure 27:
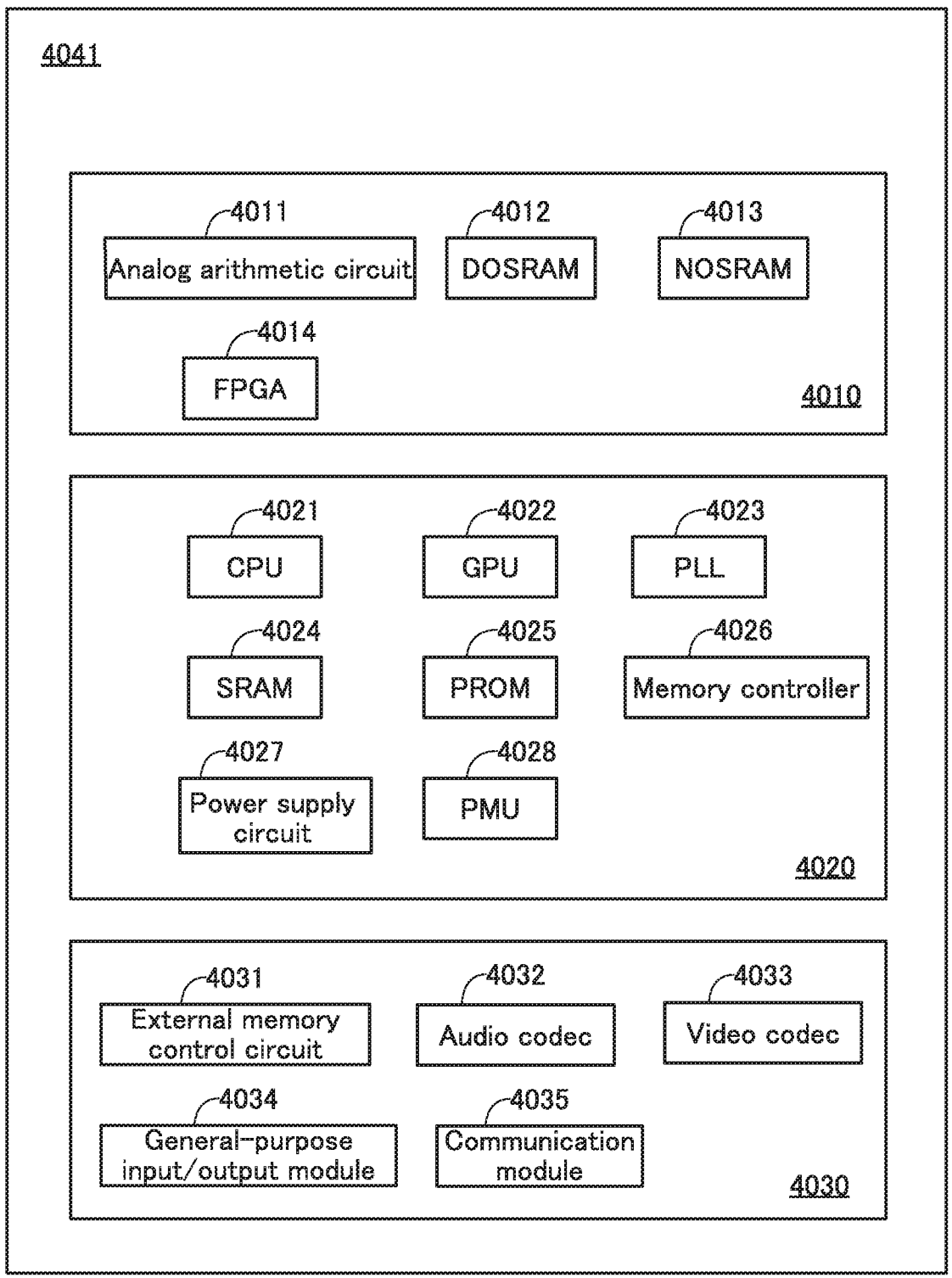
FIG. 27 A block diagram illustrating a configuration example of an AI system of one embodiment of the present invention.

FIG. 27 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400, the NOSRAM 1600, and the OS-FPGA 3110 described in the above embodiments can be used as the DOSRAM 4012, the NOSRAM 4013, and the FPGA 4014, respectively.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for the learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data have to be stored piece by piece because of the circuit area limitation and small storage capacity of the SRAM. The DOSRAM 4012 has a larger storage capacity than an SRAM because the memory cells can be highly integrated even in a limited circuit area. Therefore, the DOSRAM 4012 can efficiently store the input data.

The NOSRAM 4013 is a nonvolatile memory using an OS transistor. The NOSRAM 4013 consumes less power in writing data than other nonvolatile memories such as a flash memory, a ReRAM (Resistive Random Access Memory), and an MRAM (Magnetoresistive Random Access Memory). Furthermore, unlike a flash memory and a ReRAM in which elements deteriorate by data writing, the NOSRAM has no limitation on the number of times of data writing.

Furthermore, the NOSRAM 4013 can store multilevel data of two or more bits as well as one-bit binary data. The multilevel data storage in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 can have a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) that is described later in conjunction with hardware. Establishing the connection of the neural network with hardware enables higher speed performance.

An OS-FPGA can have a smaller memory area than an FPGA including an SRAM. Thus, addition of a context switching function causes just a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not necessarily include all of the following: the DOSRAM 4012, the NOSRAM 4013, and the FPGA 4014. One or more of the DOSRAM 4012, the NOSRAM 4013, and the FPGA 4014 are provided in connection with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in connection with the problem that is desired to be solved. The PROM 4025 can store a program for executing at least one of these methods. Furthermore, part or the whole of the program may be stored in the NOSRAM 4013.

Most of the existing programs used as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. This enables high-speed learning and inference.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. Including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. Including the OS memory, the PLL 4023 can retain an analog potential with which the clock oscillation cycle is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. This enables high-speed data transmission.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external storage device (such as an HDD (Hard Disk Drive) or an SSD (Solid State Drive)) in many cases. Therefore, the AI system 4041 preferably includes the external memory control circuit 4031 functioning as an interface with the external storage device.

Because the neural network often deals with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/ output module 4034. The general-purpose input/output module 4034 includes a USB (Universal Serial Bus) or an I2C (Inter-Integrated Circuit), for example.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, it is extremely difficult to embed the multi-level flash memory (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structure described in this embodiment can be used in appropriate combination with the structures described in the other embodiments.

Embodiment 7

In this embodiment, application examples of the AI system described in the above embodiment are described with reference to FIG. 28.

Figure 28A:
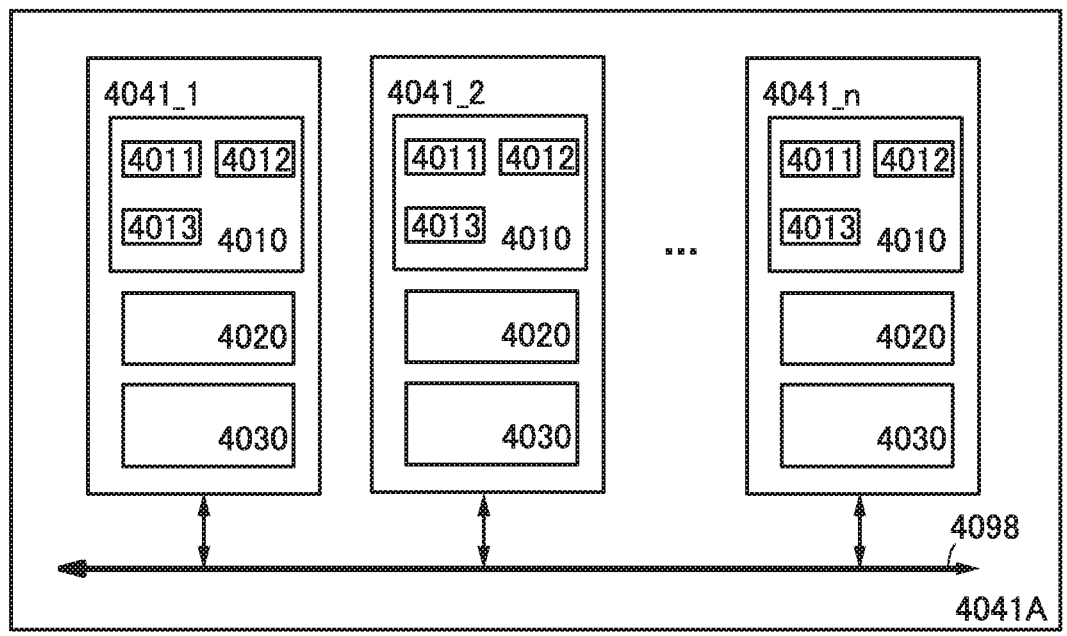
FIG. 28 Block diagrams each illustrating an application example of an AI system of one embodiment of the present invention.

FIG. 28(A) is an AI system 4041A in which the AI systems 4041 described with FIG. 27 are arranged in parallel and a signal can be transmitted between the systems via a bus line.

The AI system 4041A illustrated in FIG. 28(A) includes a plurality of AI systems 4041_1 to 4041_n (n is a natural number). The AI system 4041_1 to the AI system 4041_n are connected to each other via a bus line 4098.

Figure 28B:
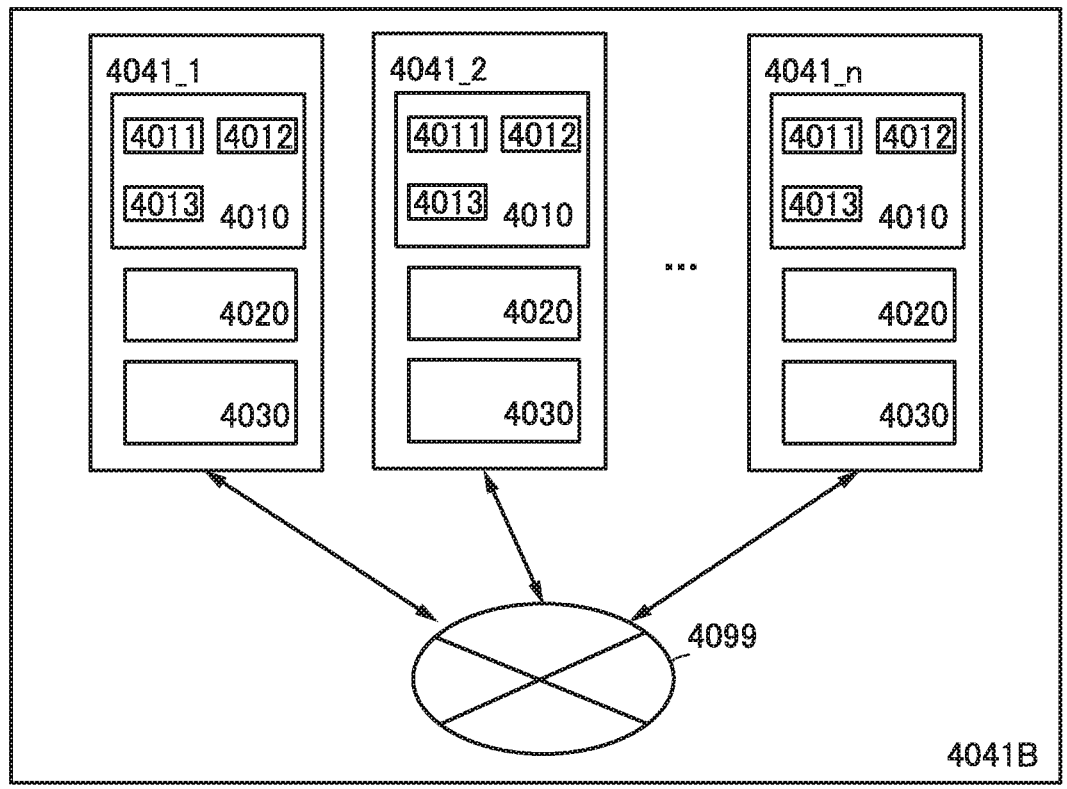

FIG. 28(B) is an AI system 4041B in which the AI systems 4041 described with FIG. 27 are arranged in parallel as in FIG. 28(A) and a signal can be transmitted between the systems via a network.

The AI system 4041B illustrated in FIG. 28(B) includes the plurality of AI systems 4041_1 to 4041_n. The AI system 4041_1 to the AI system 4041_n are connected to each other via a network 4099.

A structure may be employed in which a communication module is provided in each of the AI system 4041_1 to the AI system 4041_n so that the network 4099 can perform wireless or wired communication. A communication module can perform communication via an antenna. For example, the communication can be performed in such a manner that each electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark).

With the structure in FIG. 28(A) or FIG. 28(B), analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. When the signal processing or learning is performed by different AI systems, the amount of information processed by each AI system can be reduced. Accordingly, the signal processing or learning can be performed with a smaller amount of arithmetic processing. As a result, recognition accuracy can be increased. The information obtained with each AI system is expected to enable instant and unified understanding of biological information that changes in a complex way.

The structure described in this embodiment can be used in combination with the structures described in the other embodiments as appropriate.

Embodiment 8

In this embodiment, an example of an IC into which the AI system described in the above embodiment is incorporated is described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 29:
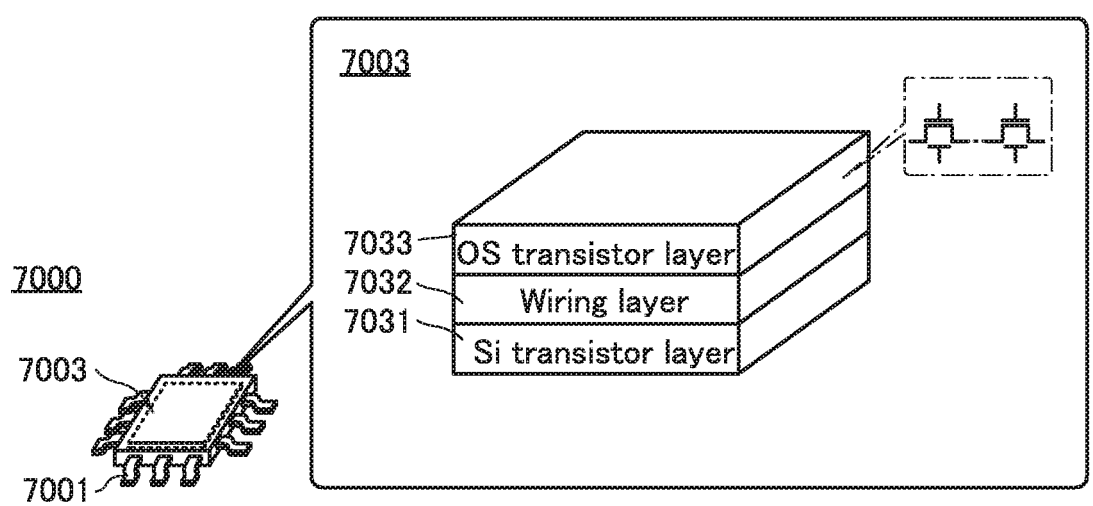
FIG. 29 A schematic perspective view illustrating a configuration example of an IC in which an AI system of one embodiment of the present invention is incorporated.

FIG. 29 illustrates the example of the IC into which the AI system is incorporated. An AI system IC 7000 illustrated in FIG. 29 includes a lead 7001 and a circuit portion 7003. In the circuit portion 7003, the various circuits described in the above embodiments are provided on one die. The circuit portion 7003 has a stacked-layer structure as illustrated in FIG. 17 in the above embodiment, and is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 29, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in combination with the structures described in the other embodiments as appropriate.

Embodiment 9

<Electronic Device>

A semiconductor device of one embodiment of the present invention can be used for a variety of electronic devices. FIG. 30 illustrates specific examples of electronic devices using the semiconductor device of one embodiment of the present invention.

Figure 30A:
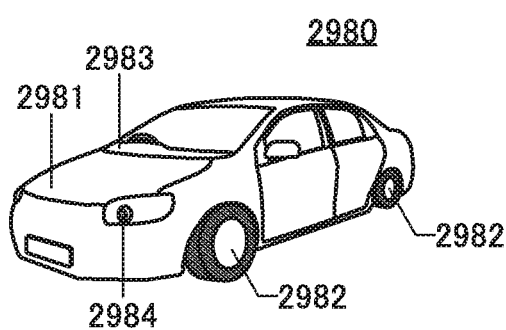
FIG. 30 Diagrams each illustrating an electronic device of one embodiment of the present invention.

FIG. 30(A) is an external view illustrating an example of an automobile. An automobile 2980 includes a car body 2981, wheels 2982, a dashboard 2983, lights 2984, and the like. The automobile 2980 also includes an antenna, a battery, and the like.

Figure 30B:
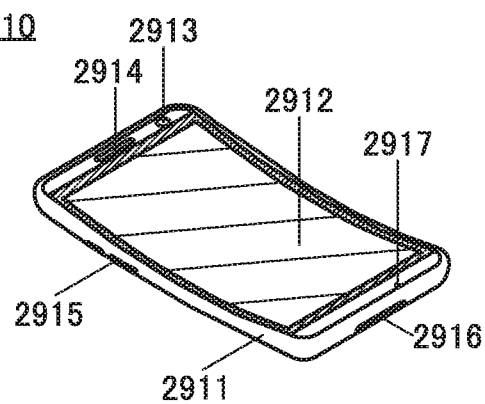

An information terminal 2910 illustrated in FIG. 30(B) includes a housing 2911, a display portion 2912, a microphone 2917, a speaker portion 2914, a camera 2913, an external connection portion 2916, operation switches 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 30C:
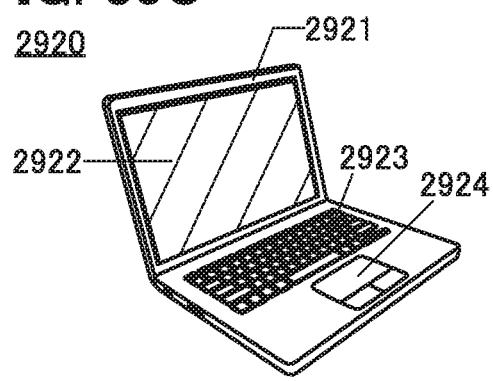

A notebook personal computer 2920 illustrated in FIG. 30(C) includes a housing 2921, a display portion 2922, a keyboard 2923, a pointing device 2924, and the like. In addition, the notebook personal computer 2920 includes an antenna, a battery, and the like inside the housing 2921.

Figure 30D:
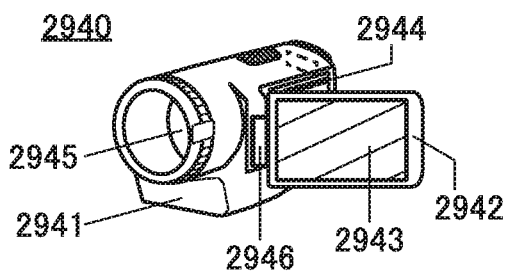

A video camera 2940 illustrated in FIG. 30(D) includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. A structure is employed in which the housing 2941 and the housing 2942 are connected to each other with the joint 2946, and the angle between the housing 2941 and the housing 2942 can be changed with the joint 2946. The orientation of an image displayed on the display portion 2943 may be changed and display and non-display of an image can be switched depending on the angle between the housing 2941 and the housing 2942.

Figure 30E:
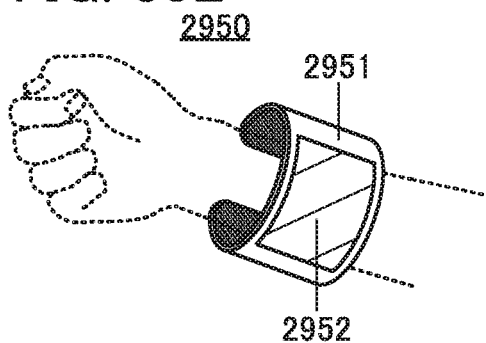

FIG. 30(E) illustrates an example of a bangle-type information terminal. An information terminal 2950 includes a housing 2951, a display portion 2952, and the like. The information terminal 2950 also includes an antenna, a battery, and the like inside the housing 2951. The display portion 2952 is supported by the housing 2951 having a curved surface. A display panel using a flexible substrate is provided in the display portion 2952, whereby the user-friendly information terminal 2950 that is flexible and lightweight can be provided.

Figure 30F:
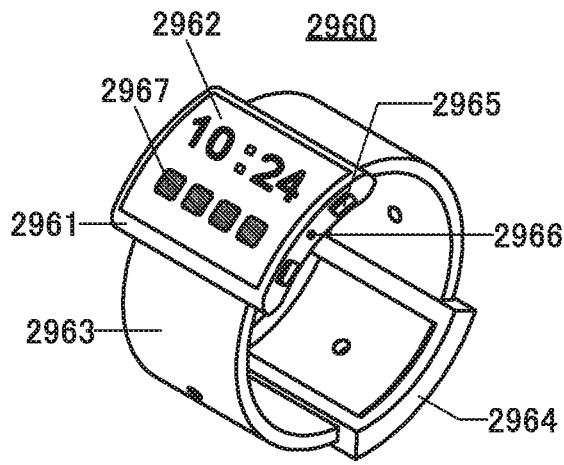

FIG. 30(F) illustrates an example of a watch-type information terminal. An information terminal 2960 includes a housing 2961, a display portion 2962, a band 2963, a buckle 2964, operation switches 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, viewing and editing texts, music reproduction, Internet communication, and a computer game.

The display surface of the display portion 2962 is curved, and display can be performed along the curved display surface. In addition, the display portion 2962 includes a touch sensor, and operation can be performed by touching the screen with a finger, a stylus, or the like. For example, with a touch on an icon 2967 displayed on the display portion 2962, an application can be started. The operation switches 2965 can have a variety of functions such as time setting, power on/off operation, on/off operation of wireless communication, setting and cancellation of a silent mode, and setting and cancellation of a power saving mode. For example, the functions of the operation switches 2965 can be set by the operation system incorporated in the information terminal 2960.

The information terminal 2960 can execute near field communication conformable to a communication standard. For example, mutual communication with a headset capable of wireless communication enables hands-free calling. Moreover, the information terminal 2960 includes the input/output terminal 2966, and thus can perform direct data transmission with another information terminal through a connector. In addition, charging can be performed via the input/output terminal 2966. Note that the charging operation may be performed by wireless power feeding without through the input/output terminal 2966.

For example, a memory device using the semiconductor device of one embodiment of the present invention can retain control data, a control program, or the like of the above-described electronic device for a long time. With the use of the semiconductor device of one embodiment of the present invention, a highly reliable electronic device can be achieved.

This embodiment can be implemented in combination with the structures described in the other embodiments as appropriate.

100: capacitor, 110: conductor, 112: conductor, 120: conductor, 130: insulator, 150: insulator, 200: transistor, 200a: transistor, 200b: transistor, 200c: transistor, 205: conductor, 205a: conductor, 205b: conductor, 210: insulator, 212: insulator, 214: insulator, 216: insulator, 218: conductor, 220: insulator, 222: insulator, 224: insulator, 230: oxide, 230A: oxide film, 230a: oxide, 230B: oxide film, 230b: oxide, 230c: oxide, 231: region, 231A: region, 231a: region, 231b: region, 232: region, 232a: region, 232b: region, 234: region, 239: region, 240: insulator, 240A: insulating film, 244: barrier film, 244A: barrier film, 246: conductor, 246a: conductor, 246b: conductor, 248: conductor, 248a: conductor, 248b: conductor, 250: insulator, 250A: insulating film, 260: conductor, 260a: conductor, 260b: conductor, 270: barrier film, 270A: barrier film, 276: barrier film, 276a: barrier film, 276b: barrier film, 280: insulator, 280A: insulating film, 281: insulator, 282: insulator, 286: insulator, 290A: film, 290b: hard mask, 292a: resist mask, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 1001: wiring, 1002: wiring, 1003: wiring, 1004: wiring, 1005: wiring, 1006: wiring, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier array, 1417: input/output circuit, 1420: MC-SA array, 1422: memory cell array, 1423: sense amplifier array, 1425: local memory cell array, 1426: local sense amplifier array, 1444: switch array, 1445: memory cell, 1446: sense amplifier, 1447: global sense amplifier, 1600: NOSRAM, 1610: memory cell array, 1611: memory cell, 1612: memory cell, 1613: memory cell, 1614: memory cell, 1640: controller, 1650: row driver, 1651: row decoder, 1652: word line driver, 1660: column driver, 1661: column decoder, 1662: driver, 1663: DAC, 1670: output driver, 1671: selector, 1672: ADC, 1673: output buffer, 2910: information terminal, 2911: housing, 2912: display portion, 2913: camera, 2914: speaker portion, 2915: operation switch, 2916: external connection portion, 2917: microphone, 2920: notebook personal computer, 2921: housing, 2922: display portion, 2923: keyboard, 2924: pointing device, 2940: video camera, 2941: housing, 2942: housing, 2943: display portion, 2944: operation switch, 2945: lens, 2946: joint, 2950: information terminal, 2951: housing, 2952: display portion, 2960: information terminal, 2961: housing, 2962: display portion, 2963: band, 2964: buckle, 2965: operation switch, 2966: input/output terminal, 2967: icon, 2980: automobile, 2981: car body, 2982: wheel, 2983: dashboard, 2984: light, 3110: OS-FPGA, 3111: controller, 3112: word driver, 3113: data driver, 3115: programmable area, 3117: JOB, 3119: core, 3120: LAB, 3121: PLE, 3123: LUT block, 3124: register block, 3125: selector, 3126: CM, 3127: power switch, 3128: CM, 3130: SAB, 3131: SB, 3133: PRS, 3135: CM, 3137: memory circuit, 3137B: memory circuit, 3140: OS-FF, 3141: FF, 3142: shadow register, 3143: memory circuit, 3143B: memory circuit, 3188: inverter circuit, 3189: inverter circuit, 4010: arithmetic portion, 4011: analog arithmetic circuit, 4012: DOSRAM, 4013: NOSRAM, 4014: FPGA, 4020: control portion, 4021: CPU, 4022: GPU, 4023: PLL, 4024: SRAM, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_1: AI system, 4041_n: AI system, 4041A: AI system, 4041B: AI system, 4098: bus line, 4099: network, 7000: AI system IC, 7001: lead, 7003: circuit portion, 7031: Si transistor layer, 7032: wiring layer, 7033: OS transistor layer

The invention claimed is:

1. A semiconductor device comprising:
an oxide over a substrate;
a first insulator over the oxide;
a second insulator over the first insulator;
a third insulator; and
a conductor over the third insulator,
wherein the oxide and the first insulator are in contact with each other in a region,
wherein an opening exposing the oxide is provided in the first insulator and the second insulator,
wherein the third insulator is placed to cover an inner wall and a bottom surface of the opening,
wherein the conductor is placed to fill the opening,
wherein the conductor includes a region overlapping with the oxide with the third insulator between the conductor and the oxide, and
wherein the first insulator contains an element other than a main component of the oxide.

2. The semiconductor device according to claim 1, wherein the oxide comprises an In—Ga—Zn oxide.

3. The semiconductor device according to claim 1, wherein the element is at least one of hydrogen and nitrogen.

4. The semiconductor device according to claim 1, wherein the first insulator comprises a silicon nitride film.

5. The semiconductor device according to claim 1, wherein a first layer comprising aluminum oxide is provided between the first insulator and the second insulator.

6. The semiconductor device according to claim 1, wherein a second layer comprising aluminum oxide is provided between the second insulator and the third insulator.

7. A semiconductor device comprising:
an oxide over a substrate;
a first insulator over the oxide;
a second insulator over the first insulator;
a third insulator;
a conductor over the third insulator;
a fourth insulator;
a fifth insulator;
a sixth insulator;
a first wiring; and
a second wiring,
wherein the oxide and the first insulator are in contact with each other in a region,
wherein a first opening exposing the oxide is provided in the first insulator and the second insulator,
wherein the third insulator is placed to cover an inner wall and a bottom surface of the first opening,
wherein the conductor is placed to fill the opening,
wherein the conductor includes a region overlapping with the oxide with the third insulator between the conductor and the oxide,
wherein the first insulator contains an element other than a main component of the oxide,
wherein the fourth insulator is placed over the second insulator, the third insulator, and the conductor,
wherein a second opening and a third opening each exposing the oxide are provided in the first insulator, the second insulator, and the fourth insulator,
wherein the fifth insulator is placed to cover an inner wall of the second opening,
wherein the first wiring is placed to fill the second opening,
wherein the sixth insulator is placed to cover an inner wall of the third opening, and
wherein the second wiring is placed to fill the third opening.

8. The semiconductor device according to claim 7, wherein the oxide comprises an In—Ga—Zn oxide.

9. The semiconductor device according to claim 7, wherein the element is at least one of hydrogen and nitrogen.

10. The semiconductor device according to claim 7, wherein the first insulator comprises a silicon nitride film.

11. The semiconductor device according to claim 7, wherein a first layer comprising aluminum oxide is provided between the first insulator and the second insulator.

12. The semiconductor device according to claim 7, wherein a second layer comprising aluminum oxide is provided between the second insulator and the third insulator.

13. A method for manufacturing a semiconductor device comprising:
forming an oxide over a substrate;
forming a first insulator over and in contact with the oxide;
forming a second insulator over the first insulator;
forming an opening in the second insulator and the first insulator, the opening reaching the oxide;
forming a third insulator covering an inner wall and a bottom surface of the opening;

depositing a first conductor over the third insulator, a first part of the first conductor filling the opening; and forming a second conductor embedded in the opening by removing a second part of the first conductor.

14. The method for manufacturing a semiconductor device according to claim 13, wherein the oxide comprises an In—Ga—Zn oxide.

15. The method for manufacturing a semiconductor device according to claim 13, wherein the first insulator comprises a silicon nitride film.

* * * * *